(12) United States Patent
Chiu et al.

(10) Patent No.: US 10,567,116 B2
(45) Date of Patent: Feb. 18, 2020

(54) WIRELESS COMMUNICATION USING CODEBOOKS FROM A QC-LDPC CODE FOR SHORTER PROCESSING LATENCY AND IMPROVED DECODER THROUGHPUT EFFICIENCY

(71) Applicant: MediaTek Inc., Hsinchu (TW)

(72) Inventors: Mao-Ching Chiu, Chiayi County (TW); Chong-You Lee, Taipei (TW); Timothy Perrin Fisher-Jeffes, Cambridge, MA (US); Cheng-Yi Hsu, Taipei (TW); Yen-Shuo Chang, Hsinchu (TW); Wei-Jen Chen, Taipei (TW); Ju-Ya Chen, Kaohsiung (TW)

(73) Assignee: MEDIATEK INC., Hsinchu (TW)

( * ) Notice: Subject to any disclaimer, the term of this patent is extended or adjusted under 35 U.S.C. 154(b) by 23 days.

(21) Appl. No.: 15/995,093

(22) Filed: May 31, 2018

(65) Prior Publication Data
US 2018/0331784 A1 Nov. 15, 2018

Related U.S. Application Data

(63) Continuation of application No. 15/594,239, filed on May 12, 2017, now Pat. No. 10,164,659.
(Continued)

(51) Int. Cl.
*H04L 1/00* (2006.01)
*H03M 13/11* (2006.01)
(Continued)

(52) U.S. Cl.
CPC ......... *H04L 1/0058* (2013.01); *H03M 13/114* (2013.01); *H03M 13/116* (2013.01);
(Continued)

(58) Field of Classification Search
CPC .. H04L 1/0058; H04L 1/0041; H03M 13/116; H04B 7/0456
See application file for complete search history.

(56) References Cited

U.S. PATENT DOCUMENTS 7,756,048 B2  7/2010  Ahrens, Jr. et al.
8,225,173 B2  7/2012  Shasha
(Continued)

FOREIGN PATENT DOCUMENTS

CN  101119178 A  2/2008
CN  101388743 A  3/2009
(Continued)

OTHER PUBLICATIONS

Mediatek Inc., "Multi-codebook embedded compact QC-LDPC designs", 3GPP TSG-RAN WG1 NR, Spokane, U.S.A., (Aug. 3-7, 2017) (Year: 2018).*
(Continued)

*Primary Examiner* — Kyle Vallecillo
(74) *Attorney, Agent, or Firm* — Han IP PLLC; Andy M. Han

(57) ABSTRACT

A processor of an apparatus selects a codebook from a plurality of codebooks embedded in a quasi-cyclic-low-density parity-check (QC-LDPC) code. The processor stores the selected codebook in a memory associated with the processor. The processor also encodes data using the selected codebook to generate a plurality of modulation symbols of the data. The processor further controls a transmitter of the apparatus to multiplex, convert, filter, amplify and radiate the modulation symbols as electromagnetic waves through one or more antennas of the apparatus. In selecting the codebook from the plurality of codebooks embedded in the QC-LDPC code, the processor selects the codebook according to one or more rules such that a small codebook requiring a shorter amount of processing latency
(Continued)

for the encoding is selected for the encoding unless a larger codebook corresponding to a larger amount of processing latency for the encoding is necessary for the encoding.

19 Claims, 18 Drawing Sheets

Related U.S. Application Data

(60) Provisional application No. 62/514,031, filed on Jun. 2, 2017, provisional application No. 62/517,219, filed on Jun. 9, 2017, provisional application No. 62/513,502, filed on Jun. 1, 2017.

(51) Int. Cl.
*H04B 7/0456* (2017.01)
*H03M 13/00* (2006.01)

(52) U.S. Cl.
CPC .... *H03M 13/1137* (2013.01); *H03M 13/1188* (2013.01); *H03M 13/6306* (2013.01); *H03M 13/6393* (2013.01); *H03M 13/6516* (2013.01); *H04B 7/0456* (2013.01); *H04L 1/0041* (2013.01); *H04L 1/0057* (2013.01); *H04L 1/0068* (2013.01)

(56) References Cited

U.S. PATENT DOCUMENTS

| | | | |
|---|---|---|---|
| 8,473,817 | B2 | 6/2013 | Shen et al. |
| 8,510,358 | B2 | 8/2013 | Yang et al. |
| 8,689,088 | B2 | 4/2014 | Lee et al. |
| 2004/0246893 | A1 | 12/2004 | Ahrens, Jr. et al. |
| 2007/0025548 | A1* | 2/2007 | Zheng ............... H04B 3/46 379/406.01 |
| 2007/0089027 | A1 | 4/2007 | Lim et al. |
| 2007/0211815 | A1 | 9/2007 | Pan et al. |
| 2008/0178065 | A1 | 7/2008 | Khandekar et al. |
| 2008/0276156 | A1 | 11/2008 | Gunnam et al. |
| 2008/0320353 | A1 | 12/2008 | Blankenship et al. |
| 2010/0257425 | A1 | 10/2010 | Yue et al. |
| 2012/0047415 | A1 | 2/2012 | Djordjevic et al. |
| 2012/0066563 | A1 | 3/2012 | Obata et al. |
| 2012/0084625 | A1 | 4/2012 | Pisek et al. |
| 2012/0089890 | A1 | 4/2012 | Palanki et al. |
| 2012/0257664 | A1 | 10/2012 | Yue et al. |
| 2015/0188734 | A1 | 7/2015 | Petrov |
| 2015/0311917 | A1 | 10/2015 | Gunnam et al. |
| 2016/0344502 | A1 | 11/2016 | Mouhouche et al. |
| 2017/0070377 | A1 | 3/2017 | Sawahashi et al. |
| 2017/0141798 | A1* | 5/2017 | Kudekar ........... H03M 13/6527 |
| 2018/0139758 | A1* | 5/2018 | Sankar .................. H04W 24/02 |
| 2018/0246783 | A1* | 8/2018 | Avraham ............ G06F 11/1068 |
| 2018/0294917 | A1 | 10/2018 | Loncke et al. |

FOREIGN PATENT DOCUMENTS

| | | |
|---|---|---|
| CN | 101741527 A | 6/2010 |
| CN | 101841390 A | 9/2010 |
| CN | 101951264 A | 1/2011 |
| CN | 102237978 A | 11/2011 |
| CN | 101682486 B | 4/2013 |
| CN | 103873186 A | 6/2014 |
| CN | 104917588 A | 9/2015 |
| CN | 105471547 A | 4/2016 |
| CN | 106253912 A | 12/2016 |
| CN | 102904583 B | 6/2017 |
| EP | 1296490 A2 | 3/2003 |
| EP | 1701450 A1 | 9/2006 |
| EP | 2461511 A1 | 6/2012 |
| EP | 2879297 A1 | 6/2015 |
| TW | 200838159 A | 9/2008 |

OTHER PUBLICATIONS

State Intellectual Property Office, International Search Report and Written Opinion for PCT Patent Application No. PCT/CN2018/071868, dated Mar. 27, 2018.
Mediatek Inc., Implementation considerations on flexible and efficient LDPC decoders, Lisbon, Portugal, Oct. 10-14, 2016.
ZTE Corp., Consideration on LDPC codes for NR, Nanjing, China, May 23-27, 2016.
Toshihiko Okamura, A Hybrid ARQ Scheme Based on Shortened Low-Density Parity-Check Codes, Wireless Communications and Networking Conference, Mar. 31, 2008, pp. 82-87, XP031243605, ISBN: 978-1-4244-1997-5, WCNC, Piscataway, NJ, USA.
Jong-Ee Oh et al., Row-Splitting Design of Low-Density Parity-Check Codes for Gbps Transmission, Vehicular Technology Conference, Sep. 1, 2007, pp. 1127-1129, XP031147582, ISBN: 978-1-4244-0263-2.
Nokia et al., LDPC Design for eMBB, 3rd Generation Partnership Project, Aug. 12, 2016, pp. 20160822-20160826, vol. RAN WG1, Mobile Competence Center, Gothenburg, Sweden.
Hui Wang et al., On the LLR Criterion Based Shortening Design for LDPC Codes, 2016 Annual Conference on Information Science and Systems, Mar. 16, 2016, pp. 87-92.
European Patent Office, Partial European Search Report for Application No. 17170825.8-1906, dated Dec. 1, 2017.
Taiwan Intellectual Property Office, Office Action for Taiwan Patent Application No. 107102523, dated Jun. 24, 2019.
Taiwan Intellectual Property Office, Office Action for Taiwan Patent Application No. 107122449, dated Jun. 28, 2019.
Zte, Discussion on Channel Coding and Modulation for New Radio Interface, 3GPP TSG RAN WG1 #84bis, R1-162229, Apr. 15, 2016, Korea.
State Intellectual Property Office, International Search Report and Written Opinion for PCT Patent Application No. PCT/CN2018/073962, dated Apr. 20, 2018.
Taiwan Intellectual Property Office, Office Action for Taiwan Patent Application No. 106129096, dated Dec. 17, 2018.
State Intellectual Property Office, International Search Report and Written Opinion for International Patent Application No. PCT/CN2018/073963, dated May 2, 2018.
Taiwan Intellectual Property Office, Office Action for Taiwan Patent Application No. 107122310 dated Jul. 24, 2019.
USPTO, Office Action for U.S. Appl. No. 15/878,357, dated Aug. 19, 2019.
State Intellectual Property Office, International Search Report and Written Opinion for International Patent Application No. PCT/CN2018/089624, dated Aug. 23, 2018.
Mediatek Inc., Multi-codebook embedded compact QC-LDPC design, 3GPP TSG-RAN WG1 NR, Spokane, U.S.A., Aug. 3-7, 2017.
State Intellectual Property Office, International Search Report and Written Opinion for International Patent Application No. PCT/CN2018/093374, dated Sep. 26, 2018.
State Intellectual Property Office, International Search Report and Written Opinion for International Patent Application No. PCT/CN2018/093167, dated Sep. 25, 2018.
Taiwan Intellectual Property Office, Office Action for Taiwan Patent Application No. 107102522, dated Oct. 17, 2019.

\* cited by examiner

WIRELESS COMMUNICATION USING CODEBOOKS FROM A QC-LDPC CODE FOR SHORTER PROCESSING LATENCY AND IMPROVED DECODER THROUGHPUT EFFICIENCY

CROSS REFERENCE TO RELATED PATENT APPLICATIONS

The present disclosure claims the priority benefit of U.S. Provisional Patent Application No. 62/513,502, filed 1 Jun. 2017, U.S. Provisional Patent Application No. 62/514,031, filed 2 Jun. 2017, as well as U.S. Provisional Application No. 62/517,219, filed 9 Jun. 2017, and is a continuation-in-part (CIP) of U.S. patent application Ser. No. 15/594,239, filed 12 May 2017. Contents of the aforementioned patent documents are herein incorporated by reference in their entirety.

TECHNICAL FIELD

The present disclosure is generally related to information coding and decoding and, more particularly, to wireless communication using codebooks from a quasi-cyclic-low-density parity-check (QC-LDPC) code for shorter processing latency and improved decoder throughput efficiency.

BACKGROUND

Unless otherwise indicated herein, approaches described in this section are not prior art to the claims listed below and are not admitted as prior art by inclusion in this section.

The 3$^{rd}$ Generation Partnership Project (3GPP) has approved plans to speed up the development of the 5th-generation (5G) New Radio (NR) specifications, it thus can be expected that standards-based 5G NR wireless communications services can be launched in the near future. The 3GPP has also agreed that QC-LDPC will be used for in 5G NR data channel. However, specifics regarding how QC-LDPC-based coding (e.g., encoding and decoding) can be implemented are not yet defined.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

In one aspect, a method of wireless communication may involve a processor of an apparatus selecting a codebook from a plurality of codebooks embedded in a QC-LDPC code. The method may also involve the processor storing the selected codebook in a memory associated with the processor. The method may further involve the processor encoding data using the selected codebook to generate a plurality of modulation symbols of the data. The method may additionally involve the processor controlling a transmitter of the apparatus to multiplex, convert, filter, amplify and radiate the modulation symbols as electromagnetic waves through one or more antennas of the apparatus. In selecting the codebook from the plurality of codebooks embedded in the QC-LDPC code, the method may involve the processor selecting the codebook according to one or more rules such that a small codebook requiring a shorter amount of processing latency for the encoding is selected for the encoding unless a larger codebook corresponding to a larger amount of processing latency for the encoding is necessary for the encoding.

In one aspect, a method of wireless communication may involve a processor of an apparatus establishing a wireless communication link with another apparatus via a transceiver of the apparatus. The method may also involve the processor selecting a codebook from a plurality of codebooks embedded in a QC-LDPC code. The method may further involve the processor encoding data using the selected codebook to generate a plurality of modulation symbols of the data. The method may additionally involve the processor controlling a transmitter of the transceiver to multiplex, convert, filter, amplify and radiate the modulation symbols as electromagnetic waves through one or more antennas of the apparatus.

It is noteworthy that, although description of the proposed scheme and various examples is provided below in the context of 5G NR wireless communications, the proposed concepts, schemes and any variation(s)/derivative(s) thereof may be implemented in communications in accordance with other protocols, standards and specifications where implementation is suitable. Thus, the scope of the proposed scheme is not limited to the description provided herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

The proposed concepts and schemes generally relate to the following areas: multi-codebook-embedded LDPC code design, hybrid orthogonal LDPC layer design, QC-LDPC support of extreme low code rate (CR), kernel matrix design, and shift-coefficient design. The area of hybrid orthogonal LDPC layer design includes the novel concepts and schemes of quasi-row orthogonal layer design and hybrid orthogonality layer design. Description of the proposed concepts and schemes is provided below with reference to FIG. 1-FIG. 9.

Figure 1:
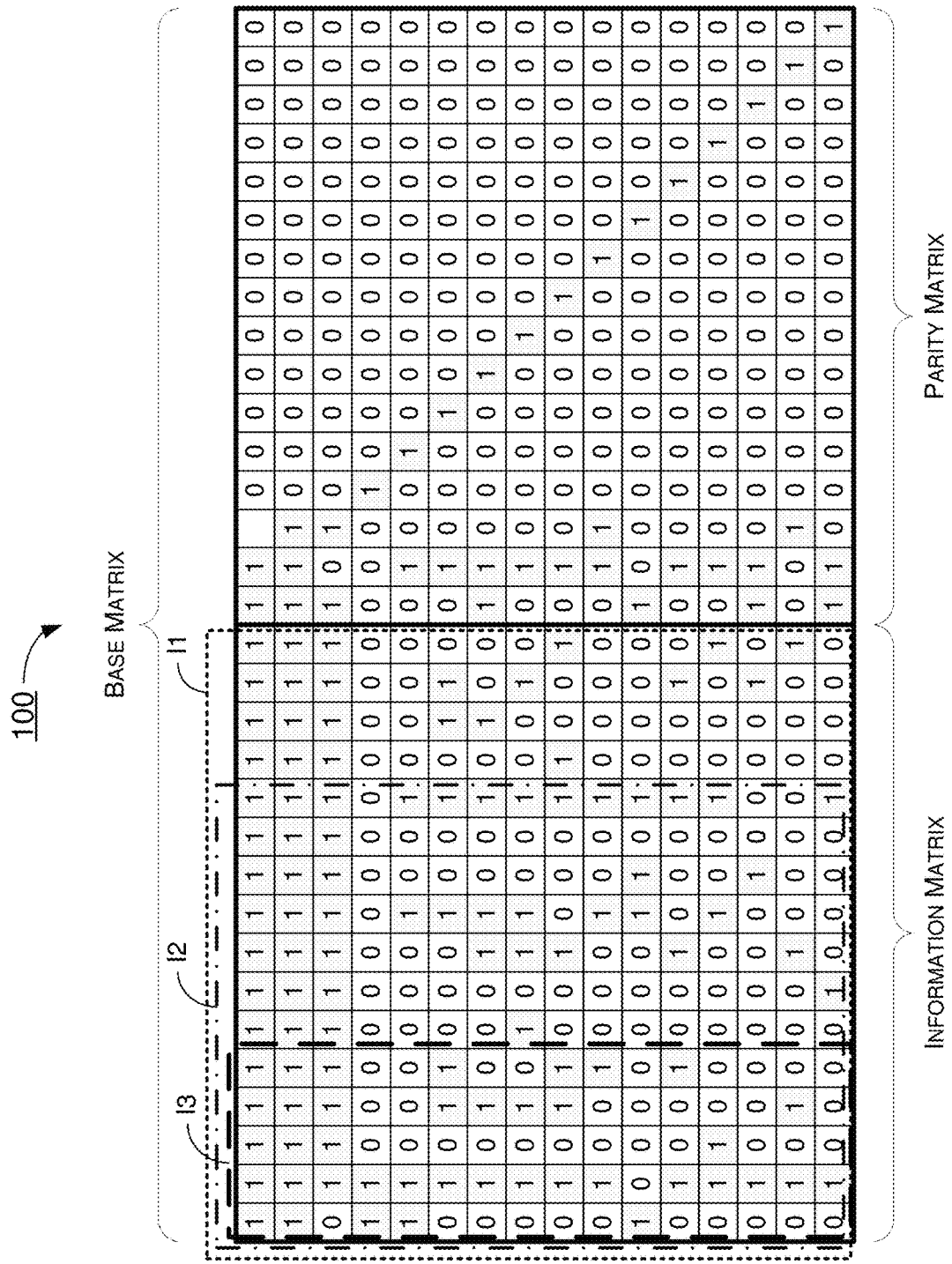
FIG. 1 is a diagram of an example multi-codebook-embedded LDPC code design in accordance with an implementation of the present disclosure.

FIG. 1 illustrates an example multi-codebook-embedded LDPC code design in accordance with an implementation of the present disclosure. Referring to FIG. 1, a base parity check matrix (herein interchangeably referred as "base matrix") 100 of a QC-LDPC code in accordance with the present disclosure may have a plurality of codebooks embedded therein.

As shown in FIG. 1, base matrix 100 may include a parity matrix of a plurality of parity bits and an information matrix of a plurality of information bits. In other words, base matrix 100 may be defined by the parity matrix and the information matrix, with the parity matrix having relatively few non-zero/non-null bits (each represented by "1" in FIG. 1) and mostly zero/null bits (each represented by "0" in FIG. 1). The parity matrix may also define a set of linear constraints on code bits. Accordingly, each codebook of the plurality of codebooks embedded in the QC-LDPC code of base matrix 100 may include the parity matrix and a respective portion of the information matrix of a corresponding size such that sizes of the plurality of codebooks are different from one another. Thus, regardless of the size, each codebook may constitute at least a portion of the base matrix. In the example shown in FIG. 1, a codebook may be expressed as follows:

$$\text{Codebook} = (I1 \text{ or } I2 \text{ or } I3) + P$$

The notation "I1" represents a first portion of the information matrix, the notation "I2" represents a second portion of the information matrix, the notation "I3" represents a third portion of the information matrix, and the notation "P" represents the parity matrix. Here, a size (e.g., in terms of number of bits and/or memory size) of I1 is greater than a size of I2, which is greater than the size of I3.

Thus, the size of the resultant codebook may vary, depending on the size of the portion of the information matrix that is utilized in combination with the parity matrix to form the codebook. It is noteworthy that, although the example shown in FIG. 1 depicts three codebooks of different sizes due to the combinations of I1+P, I2+P and I3+P, the number of codebooks of different sizes is not limited to three (and may be fewer or more than three) in various implementations in accordance with the present disclosure.

In some implementations, each codebook of the plurality of codebooks may correspond to a respective hybrid automatic repeat request (HARQ) threads of a plurality of HARQ threads that are different from one another. For instance, a first codebook may correspond to a first HARQ thread with a value in the range of 0.33~0.89. A second codebook may correspond to a second HARQ thread with a value in the range of 0.2~0.66. A third codebook may correspond to a third HARQ thread with a small code block size less than 400. Thus, in a HARQ-based communication between two communication devices, each HARQ thread of multiple HARQ threads may be correlated or otherwise associated to a respective codebook of multiple codebooks. Then, a HARQ thread that is currently utilized in the HARQ-based communication may be identified. Accordingly, one of the codebooks that corresponds to the identified HARQ thread may be selected for encoding data for transmission.

In some implementations, each codebook of the plurality of codebooks may correspond to a respective memory size (Kb) of one or more registers, one or more buffers, one or more caches and/or one or more memory cells utilized in storing the codebook. For instance, a first codebook may correspond to a first memory size Kb=16. A second codebook may correspond to a second memory size Kb=12. A third codebook may correspond to a third memory size Kb=5. Under a proposed scheme in accordance with the present disclosure, unless a larger codebook corresponding to a larger size of memory is necessary for the encoding (e.g., due to a code block size of the data to be encoded being relatively large or due to an initial code rate being relatively high), a small codebook corresponding to a small size of memory may be selected for encoding. Thus, usage of memory space larger than necessary (due to a codebook larger than necessary being selected) may be avoided, thereby shortening the processing latency for encoding.

In some implementations, all codebooks may share one base matrix with different zero-padding sizes. In some implementations, different codebooks may correspond to different shift-coefficient designs or share one shift-coefficient design.

In some implementations, the selection of which codebook of the multiple codebooks to use may be based on an initial code rate for transmission of the data, a code block size of the data, or both. In some implementations, to shorten the processing latency for encoding in a communication device, the codebook may be selected such that a small codebook requiring a shorter amount of processing latency for the encoding is selected for the encoding unless a larger codebook corresponding to a larger amount of processing latency for the encoding is necessary for the encoding.

Figure 2:
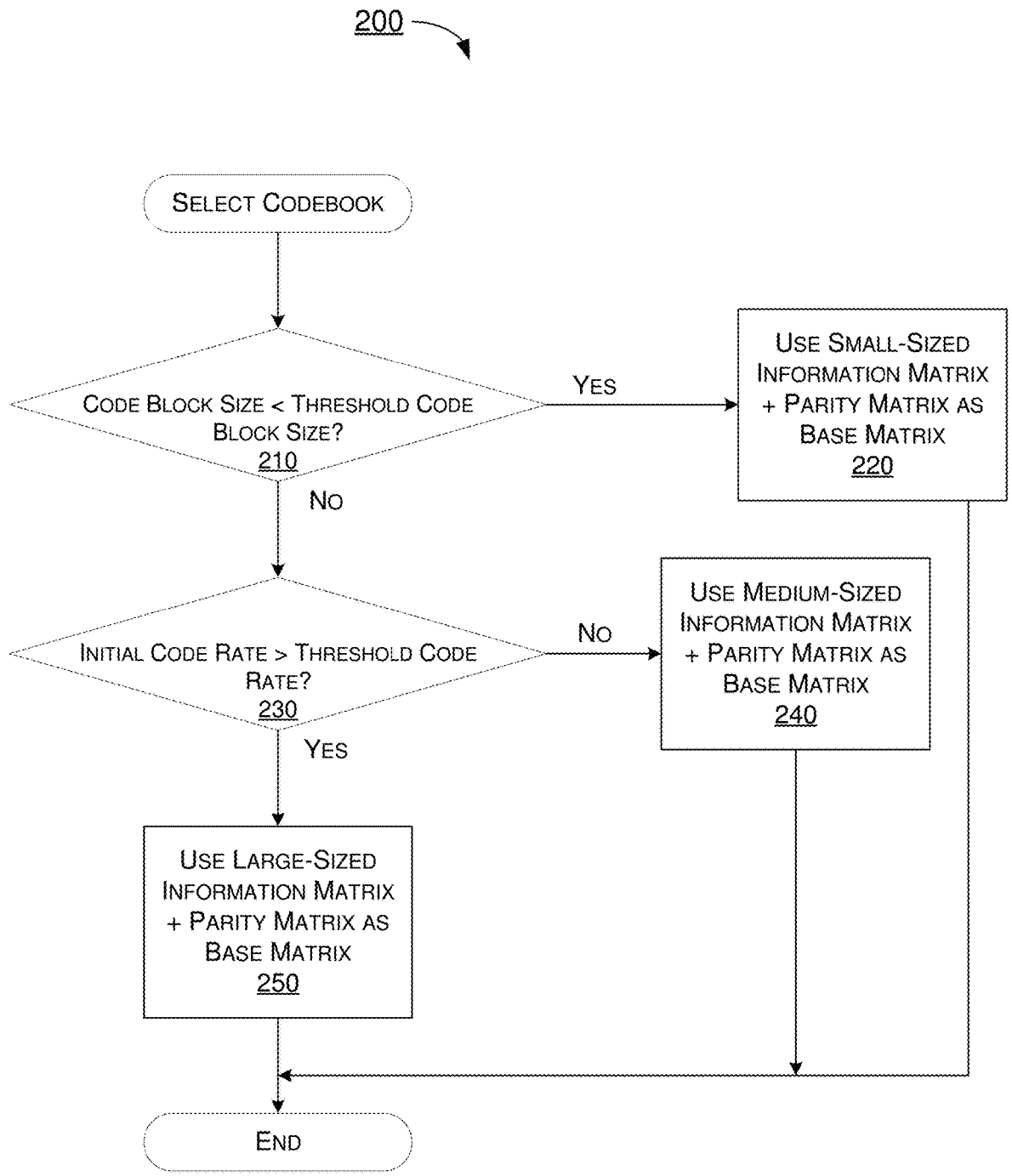
FIG. 2 is a diagram of an example logic flow related to multi-codebook-embedded LDPC code design in accordance with an implementation of the present disclosure.

FIG. 2 illustrates an example logic flow 200 related to multi-codebook-embedded LDPC code design in accordance with an implementation of the present disclosure. Logic flow 200 may be implemented in or by an encoder or a processor to effect various features and/or aspects of the proposed concepts and schemes of the present disclosure. More specifically, logic flow 200 may involve one or more rules utilized in selection of a codebook from a number of codebooks embedded in a base matrix of a QC-LDPC code such that a small codebook requiring a shorter amount of processing latency for the encoding is selected for the encoding unless a larger codebook corresponding to a larger amount of processing latency for the encoding is necessary for the encoding. Logic flow 200 may include one or more operations, actions, or functions as represented by one or more of blocks 210, 220, 230, 240 and 250. Although illustrated as discrete blocks, various blocks of logic flow 200 may be divided into additional blocks, combined into fewer blocks, or eliminated, depending on the desired implementation. Logic flow 200 may be implemented by each of first apparatus 1005 and second apparatus 1050 described below. Solely for illustrative purposes and without limiting the scope, description of logic flow 200 is provided below in the context of second apparatus 1050. Logic flow 200 may begin at 210.

At 210, logic flow 200 may involve second apparatus 1050 determining whether a code block size of data to be encoded is less than a threshold code block size. In an event that the code block size of the data is determined to be less than the threshold code block size, logic flow 200 may proceed from 210 to 220. In an event that the code block size of the data is determined to be not less than the threshold code block size, logic flow 200 may proceed from 210 to 230.

At 220, logic flow may involve second apparatus 1050 selecting a first codebook of the plurality of codebooks.

At 230, logic flow may involve second apparatus 1050 determining whether an initial code rate for transmission of the data is greater than a threshold code rate. In an event that the initial code rate is determined to be not greater than the threshold code rate, logic flow 200 may proceed from 230 to 240. In an event that the initial code rate is determined to be greater than the threshold code rate, logic flow 200 may proceed from 230 to 250.

At 240, logic flow 200 may involve second apparatus 1050 selecting a second codebook of the plurality of codebooks.

At 250, logic flow 200 may involve second apparatus 1050 selecting a third codebook of the plurality of codebooks.

Here, a size of the third codebook is larger than a size of the second codebook. Additionally, the size of the second codebook is larger than a size of the first codebook. Thus, unless a larger codebook corresponding to a larger size of memory is necessary for the encoding (e.g., the code block size is greater than the threshold code block size or the initial code rate is greater than the threshold code rate), logic flow 200 would select a small codebook corresponding to a small size of memory, thereby minimizing the amount or size of memory utilized to store the selected codebook. That is, logic flow 200 may help shorten the processing latency for encoding.

Figure 3:
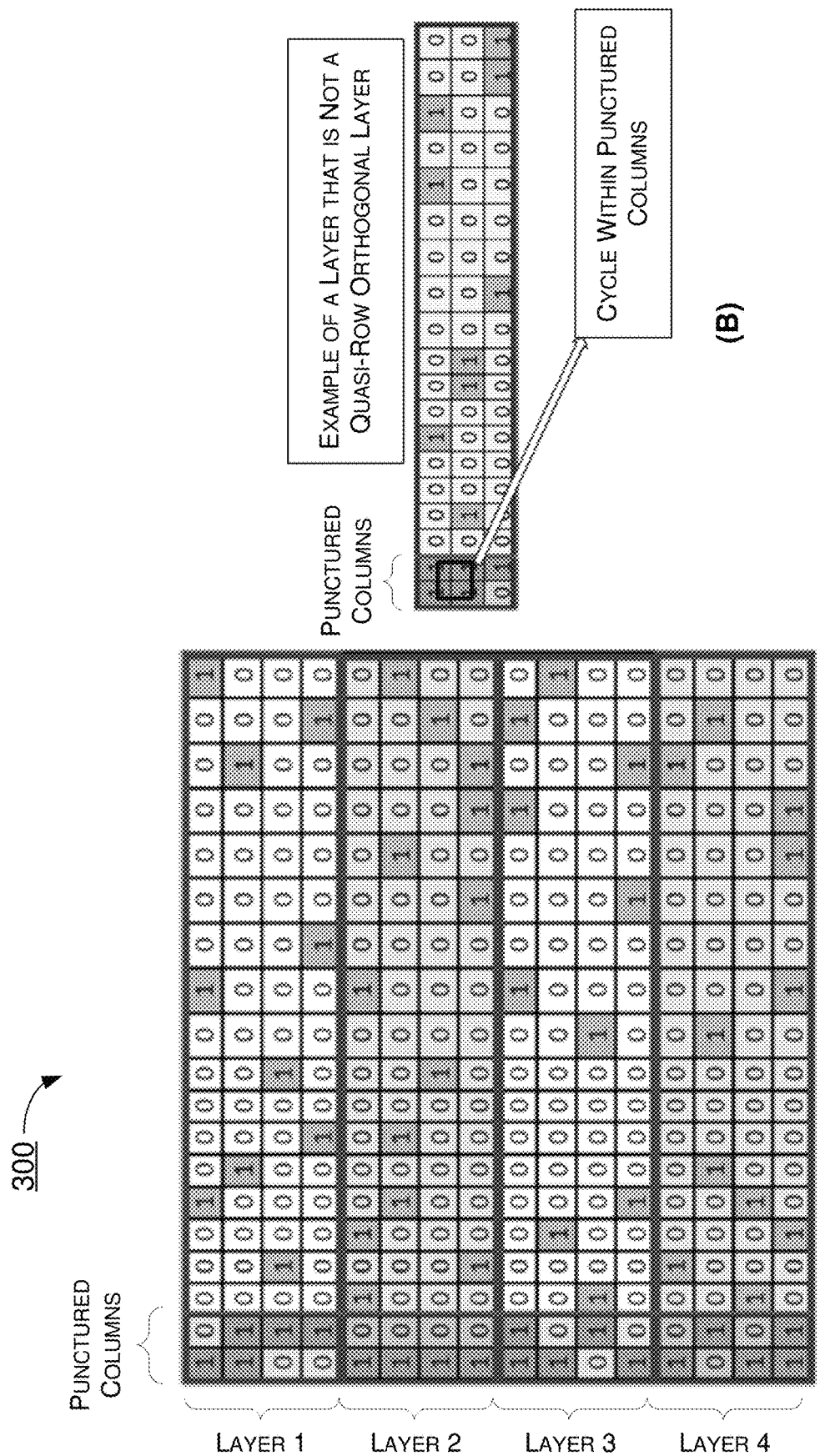
FIG. 3 is a diagram of an example quasi-row orthogonal layer design in accordance with an implementation of the present disclosure.

FIG. 3 illustrates an example quasi-row orthogonal layer design 300 in accordance with an implementation of the present disclosure. Orthogonality is good for LDPC decoder throughput efficiency. In the LDPC code, several rows may be grouped together to form a layer and each column within the layer may be of degree one or zero (i.e., orthogonal). In such cases the layer is referred as a pure-row orthogonal layer.

Referring to FIG. 3, in quasi-row orthogonal layer design 300, several rows may be grouped together to form a quasi-row orthogonal layer, such as Layer 1, Layer 2, Layer 3 and Layer 4 as shown in FIG. 3. In this example, each column within each of Layer 1, Layer 2, Layer 3 and Layer 4 may be of degree one or zero (i.e., orthogonal) with the exception of one or more punctured columns. In the example shown in part (A) of FIG. 3, the two leftmost columns are punctured columns. Each of the other columns in each of Layer 1, Layer 2, Layer 3 and Layer 4 is of degree one or zero (i.e., with one or zero non-zero/non-null bit as represented by "1" and other bits being zero/null as represented by "0"). Advantageously, quasi-row orthogonal layer design 300 provides orthogonality that helps improve the efficiency in decoder throughput.

Moreover, in quasi-row orthogonal layer design 300, there is no cycle within the punctured columns in the quasi-row orthogonal layer. In the example shown in part (B) of FIG. 3, as a cycle exists within the two punctured columns, the corresponding layer is not considered as a quasi-row orthogonal layer in accordance with the present disclosure.

Figure 4:
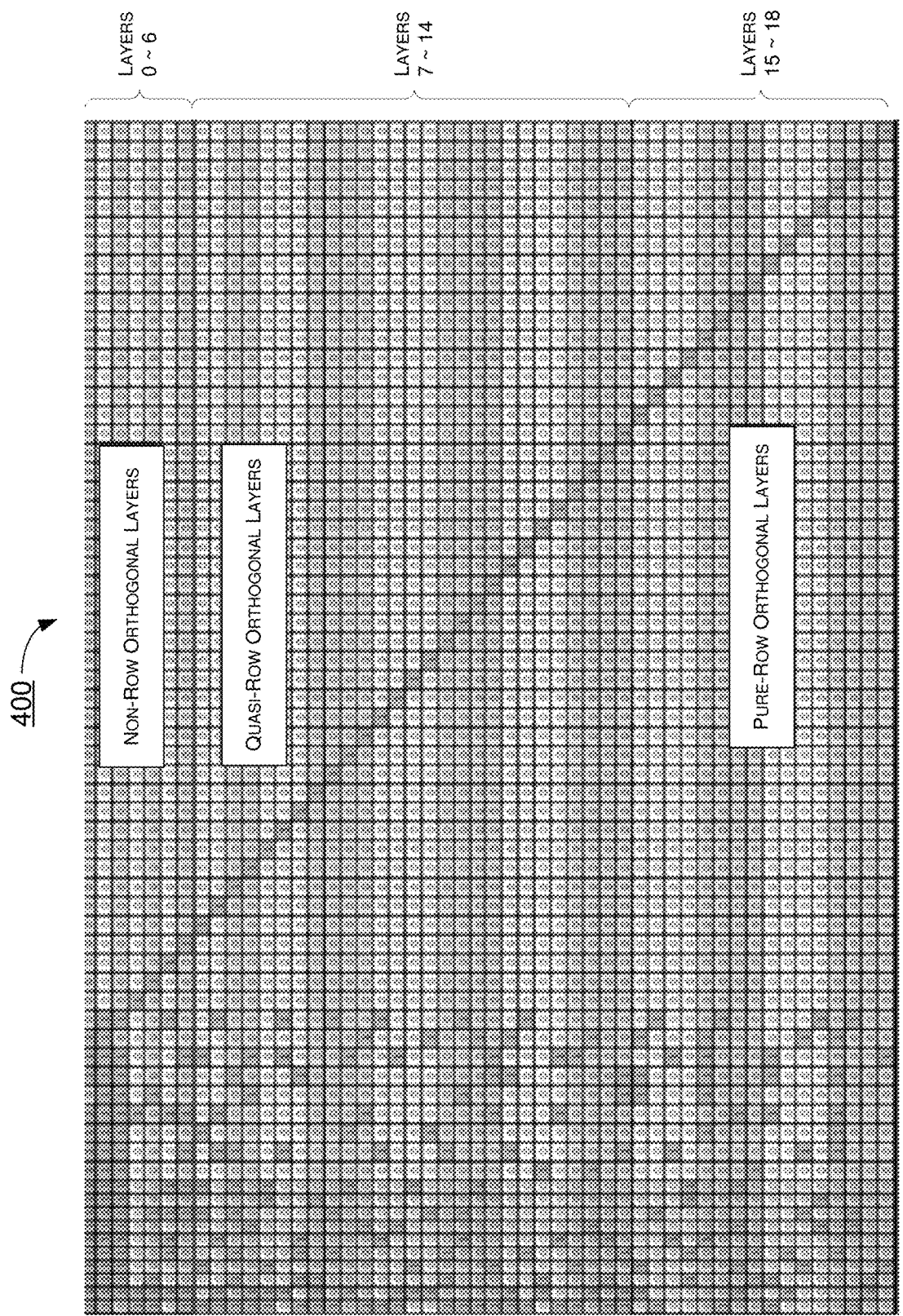
FIG. 4 is a diagram of an example hybrid orthogonality layer design in accordance with an implementation of the present disclosure.

FIG. 4 illustrates an example hybrid orthogonality layer design 400 in accordance with an implementation of the present disclosure. In hybrid orthogonality layer design 400, a QC-LDPC code may include a plurality of portions of different degrees of orthogonality. In the example shown in FIG. 4, blocks of darker color represent bits of 1 while blocks of lighter color represent bits of 0. For instance, a first portion of the plurality of portions may be of a low degree of orthogonality and may correspond to a high code rate. Likewise, a second portion of the plurality of portions may be of a medium degree of orthogonality and may correspond to a medium code rate. Similarly, a third portion of the plurality of portions may be of a high degree of orthogonality and may correspond to a low code rate.

In the example shown in FIG. 4, the plurality of portions of different degrees of orthogonality include the following: (1) a non-row orthogonal portion including a plurality of rows and a plurality of columns that form at least one non-row orthogonal layer corresponding to relatively higher code rate(s), (2) a quasi-row orthogonal portion including a plurality of rows and a plurality of columns that form the at least one quasi-row orthogonal layer corresponding to medium code rate(s), and (3) a pure-row orthogonal portion including a plurality of rows and a plurality of columns that form at least one pure-row orthogonal layer corresponding to relatively lower code rate(s). Here, each column of the plurality of columns of the non-row orthogonal portion is a column of degree two or more. Additionally, one or more columns of the plurality of columns of the quasi-row orthogonal portion include punctured columns of degree two or more. Moreover, the remaining columns of the plurality of columns of the quasi-row orthogonal portion may include non-punctured columns of degree one or zero. Furthermore, each column of the plurality of columns of the pure-row orthogonal portion includes a column of degree one or zero.

Figure 5:
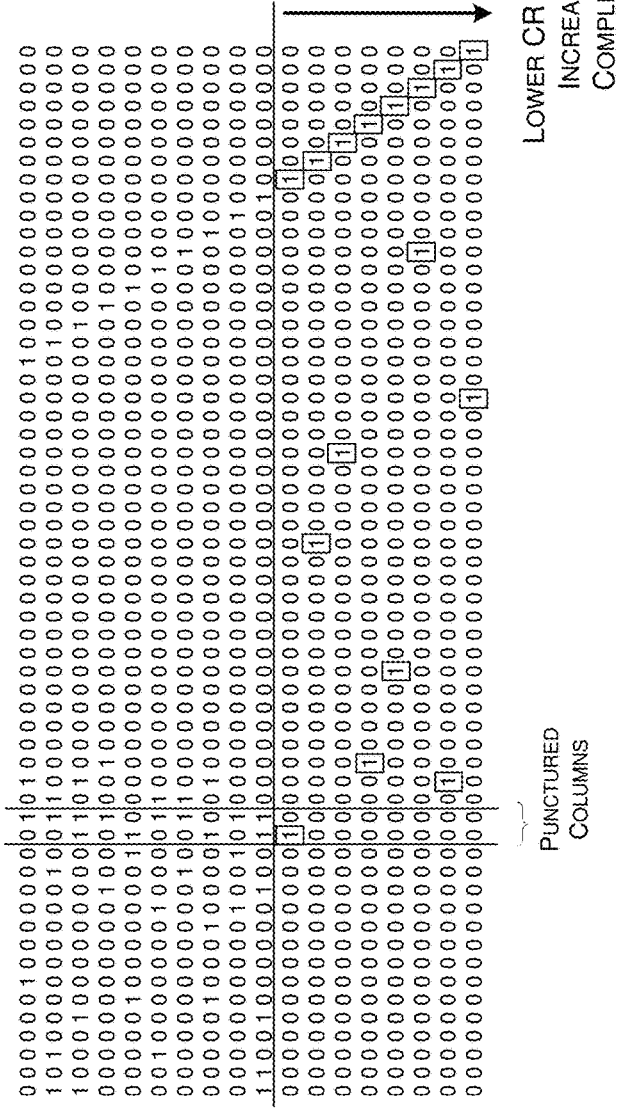
FIG. 5 is a diagram of an example QC-LDPC code that supports extreme low code rate in accordance with an implementation of the present disclosure.

FIG. 5 illustrates an example QC-LDPC code 500 that supports extreme low code rate in accordance with an implementation of the present disclosure. Referring to FIG. 5, QC-LDPC code 500 may include a parity matrix of a plurality of parity bits and an information matrix of a plurality of information bits. The information matrix may include one or more rows of bits each of degree two. Moreover, each bit of bits of the degree two of the one or more rows of bits of degree two may be a previously-used parity bit or a previously-transmitted information bit. Furthermore, for extreme low code rates, one or more previous transmissions may be repeated. Accordingly, an extended row may have a weight of two. Node split may be checked for rows with large weight.

Figure 6:
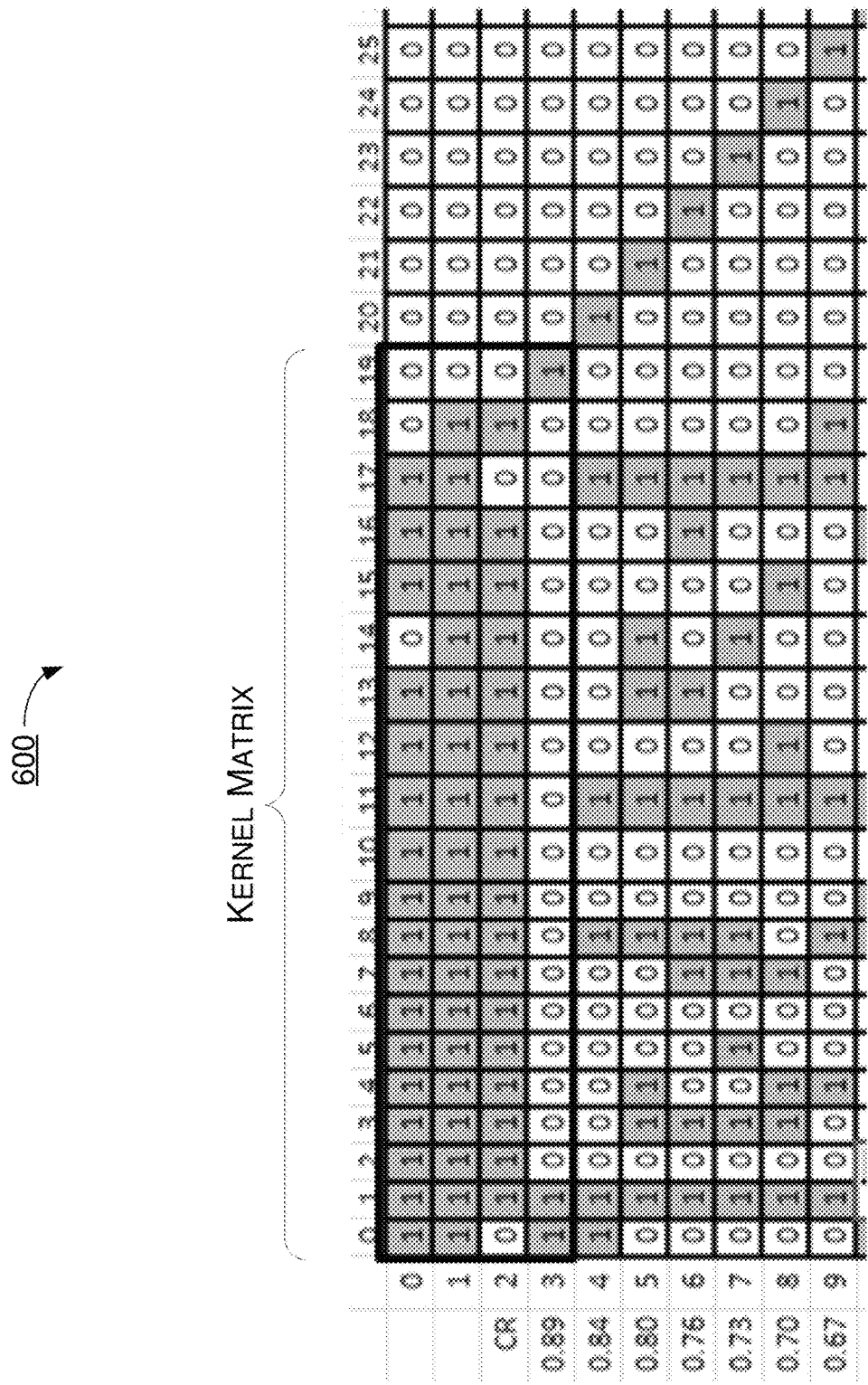
FIG. 6 is a diagram of an example kernel matrix design in accordance with an implementation of the present disclosure.

FIG. 6 illustrates an example kernel matrix design 600 in accordance with an implementation of the present disclosure. Referring to FIG. 6, in kernel matrix design 600, a QC-LDPC code may include a base matrix with a portion of forming a kernel matrix that corresponds to a code rate of at least a threshold value. For instance, in the example shown in FIG. 6, the kernel matrix supports a code rate of 0.89.

Figure 7:
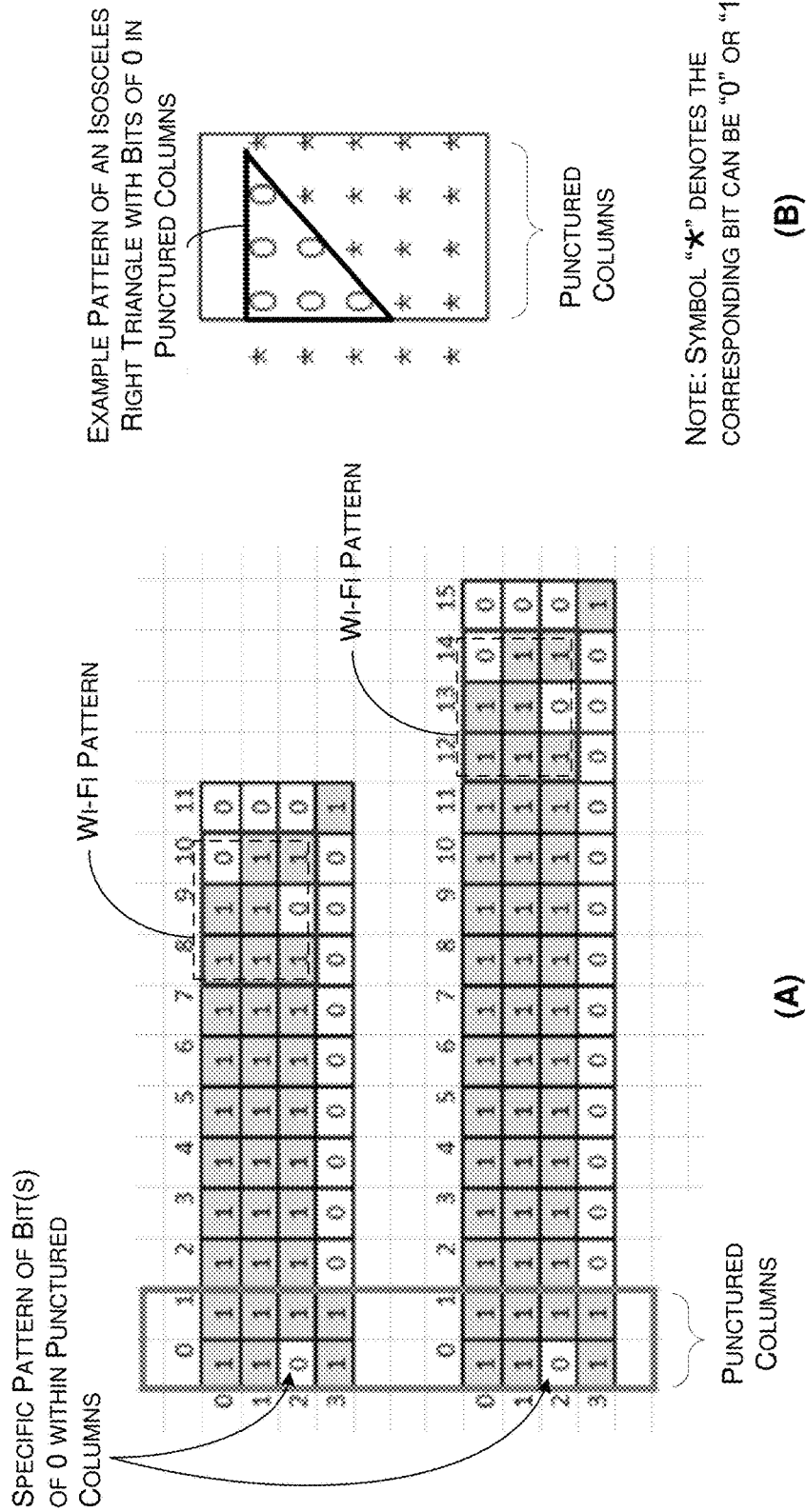
FIG. 7 is a diagram of an example concept of kernel base matrix in accordance with an implementation of the present disclosure.

FIG. 7 illustrates an example concept 700 of kernel base matrix in accordance with an implementation of the present disclosure. Referring to FIG. 7, the kernel matrix may include a plurality of rows and a plurality of columns of bits, with two or more of the columns being punctured columns having a specific pattern of bits (e.g., one or more bits of 0). In some implementations, the specific pattern of bits in the punctured columns may include an isosceles right triangle of bits of 0, with a right angle of the triangle corresponding to a bit of 0 at an upper-left corner of the punctured columns.

The kernel matrix may include a parity matrix of a plurality of rows and a plurality of columns of bits. The kernel matrix may also include an information matrix of a plurality of rows and a plurality of columns of bits. The parity matrix may include a matrix having a Wi-Fi pattern (e.g., Wi-Fi like parity matrix). Moreover, more than one rows of bits of the information matrix may include rows of high density of bits of 1 with no or one bit of 0. A bottom row of bits of the plurality of rows may include a first number of bits of 1. The first number may be equal to or greater than a number of punctured columns by 1.

In the example shown in part (A) of FIG. 7, the first several rows (e.g., three rows) are composed of Wi-Fi like parity matrix, and the information matrix has very high density of bits of 1. Specifically, each row in the information matrix includes mostly, if not all, bits of 1 with none or one bit of 0. The punctured columns include a specific pattern of one or more bits of 0 after any number of column permutation(s) and/or row permutation(s) (e.g., at least one column permutation, at least one row permutation, or any combination thereof). The bottom row may have three or four edge blocks. One edge block may correspond to parity variable node (VN) block. Two edge blocks may correspond to the two punctured columns (e.g., VN0 and VN1). In cases where there are four edge blocks, the fourth edge block may be added to increaser the minimum distance.

In the example shown in part (B) of FIG. 7, an example pattern of the punctured column is shown. For a base matrix of size m×n (m rows by n columns) and assuming a number of p columns is/are punctured, a m×p matrix may be constructed with an isosceles right triangle of bits of 0, with a right angle of the triangle corresponding to a bit of 0 at an upper-left corner of the punctured columns. Other bits in the punctured column(s) may be randomly selected to be 0 or 1. As row permutation and/or column permutation may be performed, the actual location of the specific pattern may be different from the upper-left corner of the puncture column(s).

Figure 8:
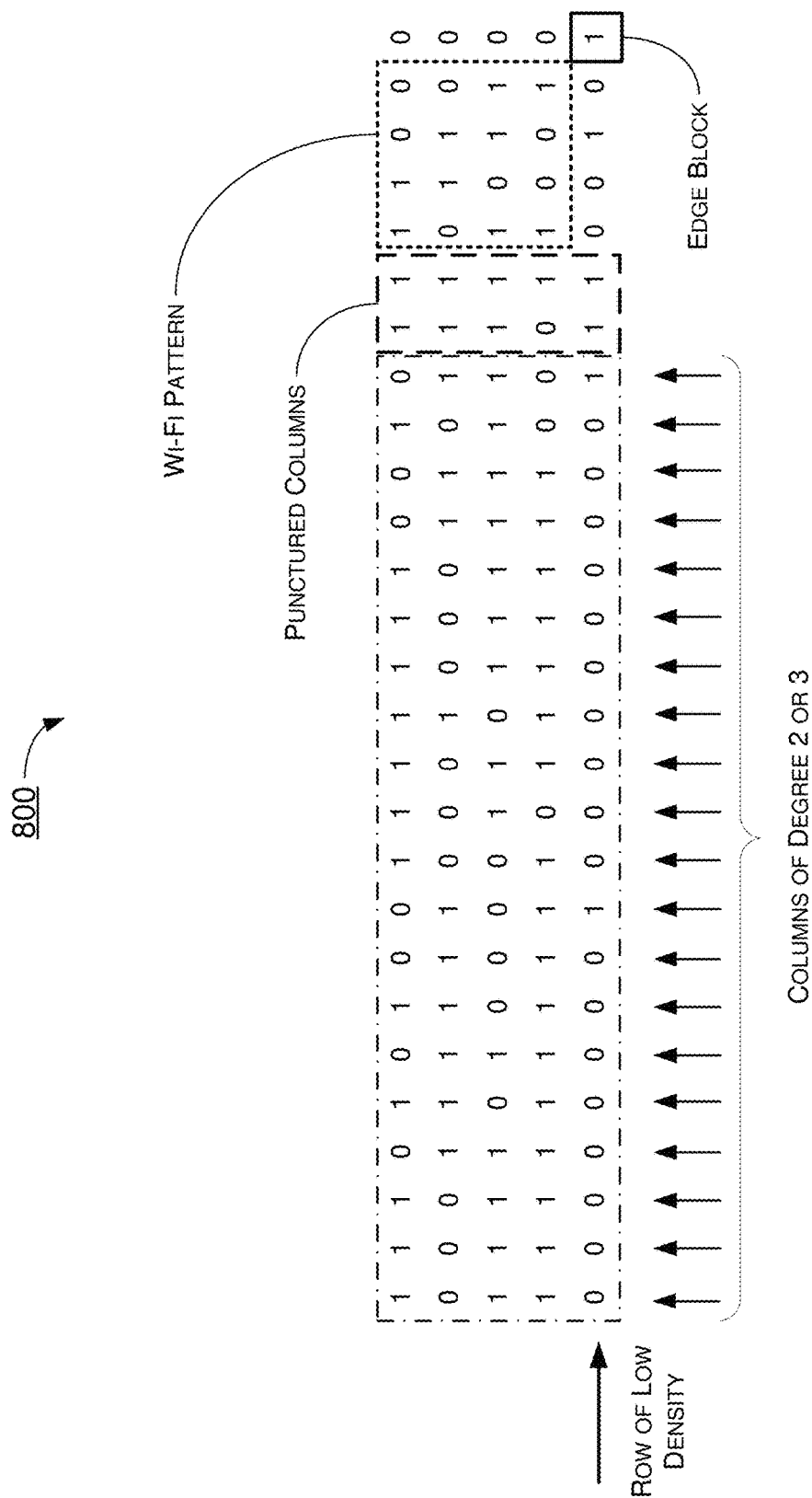
FIG. 8 is a diagram of an example concept of kernel base matrix in accordance with another implementation of the present disclosure.

FIG. 8 illustrates an example concept 800 of kernel base matrix in accordance with another implementation of the present disclosure. In concept 800, the kernel matrix includes a Wi-Fi pattern (or Wi-Fi like parity matrix), punctured columns, and remaining portion of the information matrix. The remaining portion of the information matrix may be designed with one of a number of degree distributions. For instance, the kernel matrix may include five rows of bits and twenty columns of bits. A variable node (VN) degree of the twenty columns of bits may include one of the following: [2, 2, 2, 2, 2, 3, 3, 3, 3, 3, 3, 3, 3, 3, 3, 3, 3, 3, 3, 3], [2, 2, 2, 2, 3, 3, 3, 3, 3, 3, 3, 3, 3, 3, 3, 3, 3, 3, 3, 3], [2, 2, 2, 3, 3, 3, 3, 3, 3, 3, 3, 3, 3, 3, 3, 3, 3, 3, 3, 3], and [2, 2, 3, 3, 3, 3, 3, 3, 3, 3, 3, 3, 3, 3, 3, 3, 3, 3, 3, 3]. A check node (CN) degree of the five rows of bits may include one of the following: [13, 10, 14, 17, 2], [13, 10, 13, 17, 2], [13, 10, 13, 18, 3], [13, 11, 13, 18, 2], [13, 10, 14, 18, 2], [13, 10, 13, 19, 2], [14, 10, 13, 18, 1], [13, 11, 13, 18, 1], [13, 10, 14, 18, 1], [13, 11, 13, 19, 1], [13, 10, 13, 18, 2], and [13, 10, 13, 18, 1].

Figure 9:
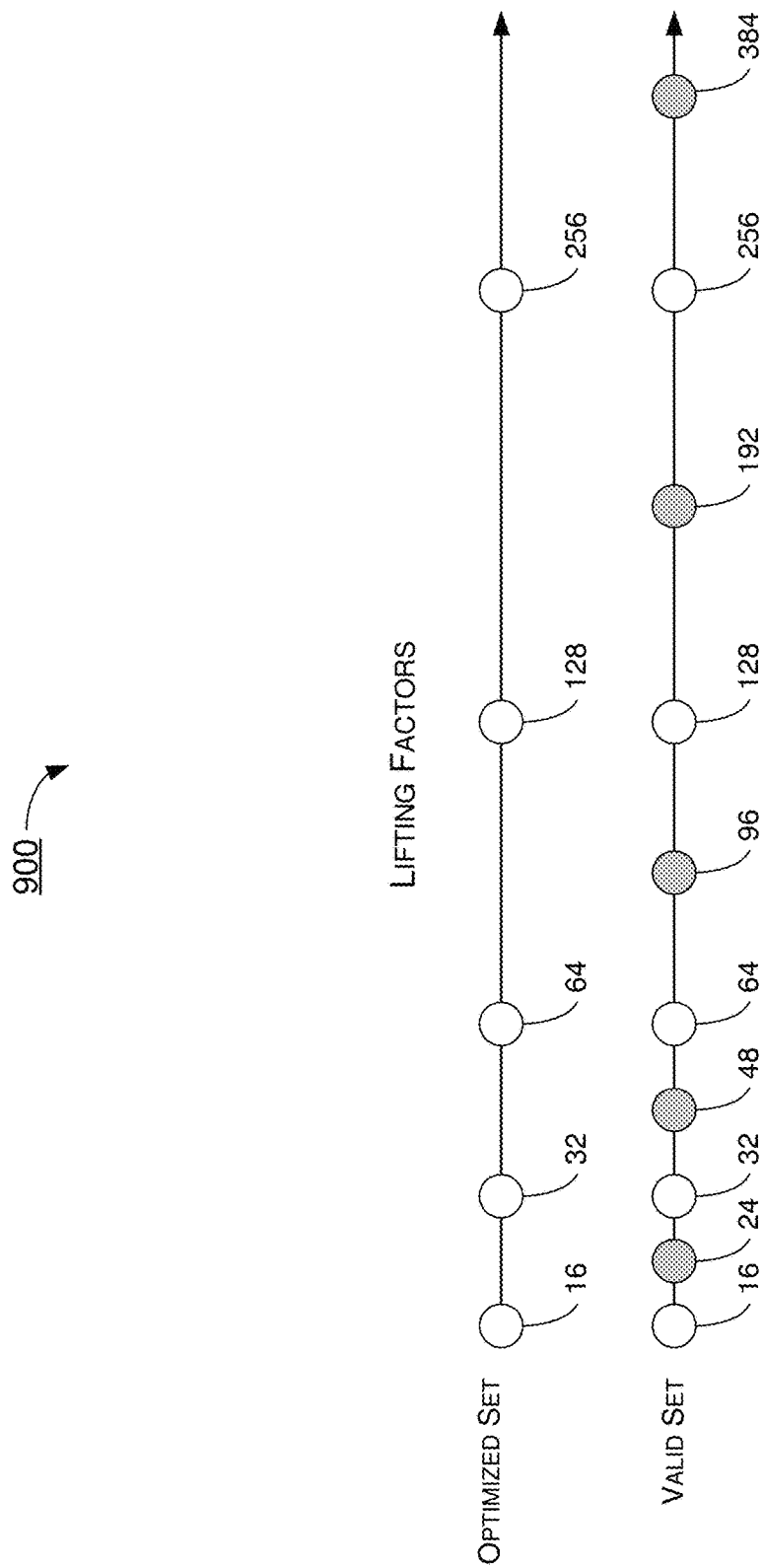
FIG. 9 is a diagram of an example shift-coefficient design in accordance with an implementation of the present disclosure.

FIG. 9 illustrates of an example shift-coefficient design 900 in accordance with an implementation of the present disclosure. For each lifting factor, there may be a table of corresponding shift values. The tables among different lifting factors may be nested designed. In shift-coefficient design 900, a valid set of lifting factors may be defined for use in LDPC encoding. In the example shown in FIG. 9, the valid set of lifting factors includes the following lifting factors of different values: Z=16, Z=24, Z=32, Z=48, Z=64, Z=96, Z=128, Z=192, Z=256 and Z=384. In shift-coefficient design 900, the valid set of lifting factors may be optimized to obtain an optimized set of lifting factors. The number of lifting factors in the optimized set is less than the number of lifting factors in the valid set. The table of shift values designed for the closest and smaller or equal lifting factor within the optimized set may be used. For instance, the table of shift values designed for the lifting factor Z=32 may be shared by the lifting factor Z=48. Similarly, the table of shift values designed for the lifting factor Z=128 may be shared by the lifting factor Z=192.

For illustrative purposes and without limitation, in a LDPC codebook in accordance with the present disclosure, an optimized set of lifting factors (Z) may be defined as four sets with $Z \in X = \{a \times 2^j\}$ $\forall a \in \{9, 11, 13, 15\}$, $j \in \{0, 1, 2, 3, 4, 5\}$. A valid set of lifting factors may also be defined as eight sets with $Z \in \varphi = \{a \times 2^j\}$ $\forall a \in \{9, 10, 11, 12, 13, 14, 15, 16\}$, $j \in \{0, 1, 2, 3, 4, 5\}$. The corresponding shift values may be represented by four shift-coefficient tables which may correspond to shift coefficients of $\{288, 352, 416, 480\}$. For any lifting factor of $Z = a \times 2^j$ within the valid set $\varphi$, the corresponding shift coefficient may be obtained by $p_z^{m,n} = (p^{m,n} \mod \hat{Z}) + f(Z)$, where $p^{m,n}$ is the shift coefficient of the (m,n)th element in the shift-coefficient tables for $â×2^5$ where $â$ is the largest value within $\{9, 11, 13, 15\}$ which is smaller than or equal to a and $\hat{Z}=â×2^j$. Moreover, f(Z) is the perturbation which is a function of Z and may be represented by a table.

The use of lifting factors allows packets of various sizes to be encoded with a relatively small set of base matrices and a relatively small set of lifting factors. For instance, a base matrix of size m×n may be utilized to encode a packet of up to k=n−m information bits to obtain a coded packet or codeword of n code bits. With a lifting factor Z the base matrix may be lifted to generate a lifted parity check matrix of dimension Z·m×Z·n. The lifted parity check matrix may then be utilized to encode a packet of up to Z·k information bits to obtain a codeword of Z·n code bits. Moreover, the use of lifting factors also allows efficient parallel encoding and decoding, thereby improving performance, as well as reduces description complexity for LDPC codes of large sizes.

Figure 15:
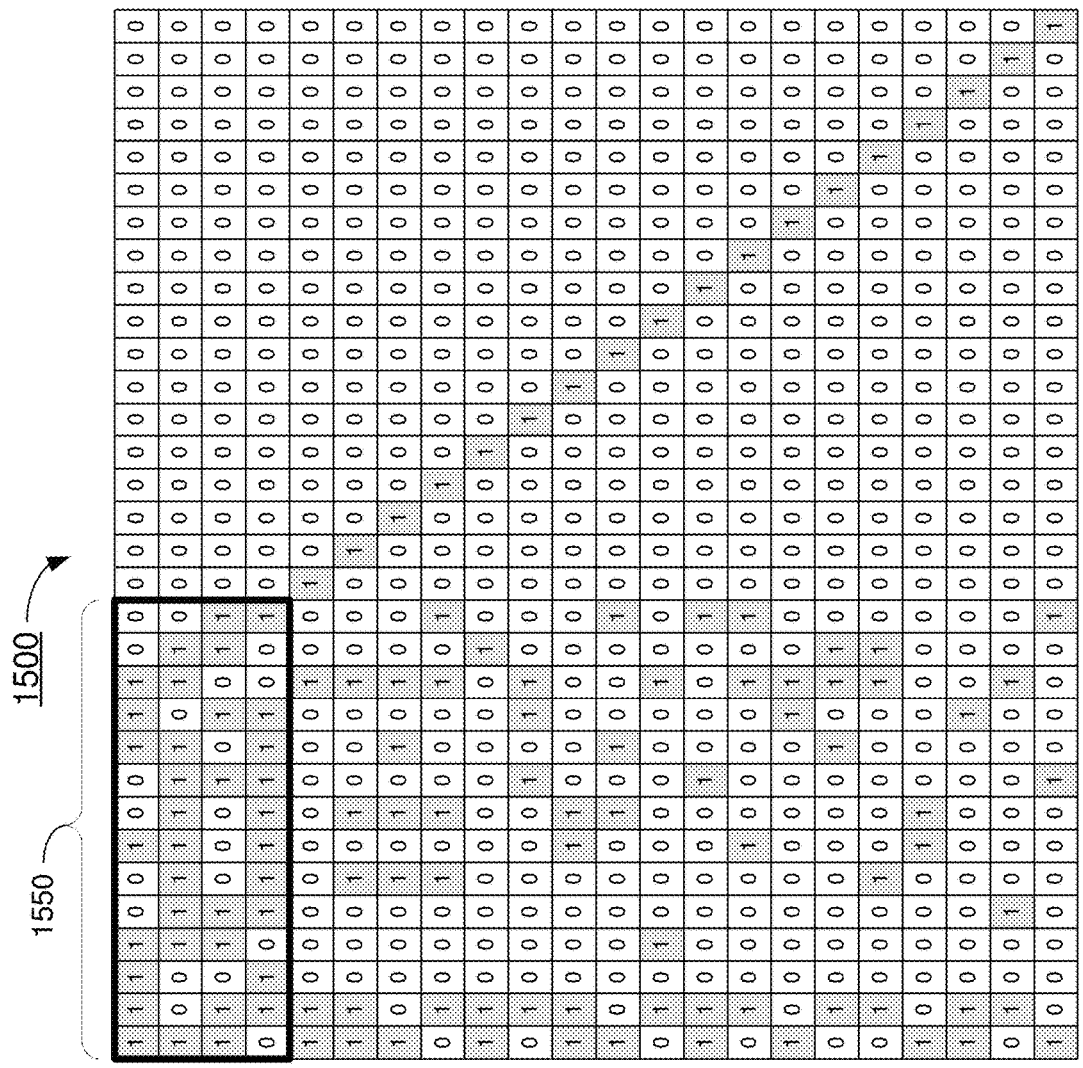
FIG. 15 is a diagram of an example base matrix in accordance with an implementation of the present disclosure.
Figure 16:
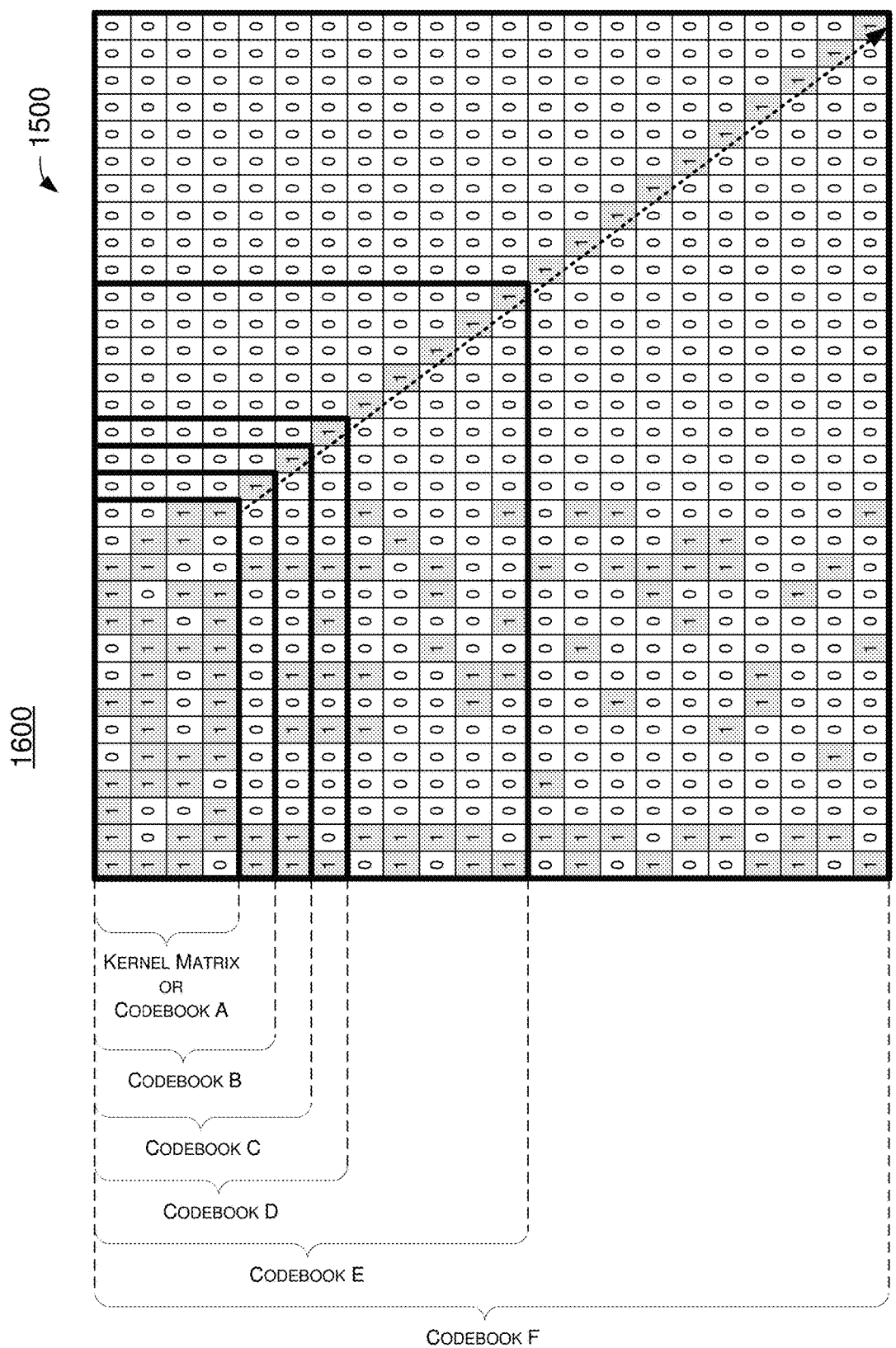
FIG. 16 is a diagram of an example scenario of deriving various codebooks from the base matrix of FIG. 15 in accordance with an implementation of the present disclosure.

FIG. 15 illustrates an example base matrix 1500 in accordance with an implementation of the present disclosure. FIG. 16 illustrates an example scenario 1600 of deriving codebooks from base matrix 1500 in accordance with an implementation of the present disclosure. Referring to FIG. 15, base matrix 1500 may include a kernel matrix 1550 as a portion (e.g., upper-left corner) of base matrix 1500. One or more columns of the plurality of columns of base matrix 1500 may include at least one punctured column of degree two or more. For instance, the two leftmost columns of base matrix 1500 may be punctured columns.

In some implementations, base matrix 1500 may include parity bits and information bits, with some being non-zero/non-null bits and some being zero/null bits, arranged in rows and columns. In the example shown in FIG. 15, base matrix 1500 includes parity bits and information bits arranged in twenty-two rows and thirty-two columns (size of 22×32), or twenty-two bit strings each having thirty-two bits, in a pattern as follows:
Row 1: 11110010011100000000000000000000
Row 2: 10011111110110000000000000000000
Row 3: 11011000101011000000000000000000
Row 4: 01101111111001000000000000000000
Row 5: 11000000000100100000000000000000
Row 6: 11000101000100010000000000000000
Row 7: 10000101010100001000000000000000
Row 8: 01000101000101000100000000000000
Row 9: 11000000000010000010000000000000
Row 10: 01000000101100000001000000000000
Row 11: 11000011000000000000100000000000
Row 12: 10000001010010000000010000000000
Row 13: 01010000000100000000001000000000
Row 14: 11000000010000100000000100000000
Row 15: 01000010000101000000000010000000
Row 16: 10000000000110000000000001000000
Row 17: 01000000001011000000000000100000
Row 18: 01000100000110000000000000010000
Row 19: 10000011000000000000000000001000
Row 20: 11000000000100000000000000000100
Row 21: 01001000000100000000000000000010
Row 22: 10000000100001000000000000000001

In the example shown in FIG. 15, kernel matrix 1550 includes information bits arranged in four rows and fourteen columns (size of 4×14), or four bit strings each having fourteen bits, in a pattern as follows:
Row 1: 11110010011100
Row 2: 10011111110110
Row 3: 11011000101011
Row 4: 01101111111001

Referring to FIG. 15 and FIG. 16, each column of kernel matrix 1550 may be of degree two or more. That is, each column in kernel matrix 1550 may include two or more bits of 1 with the remaining bit(s) being 0.

Under a proposed scheme in accordance with the present disclosure, base matrix 1500 may form a QC-LDPC code and may be utilized to generate or otherwise provide a plurality of codebooks of various sizes. In some implementations, kernel matrix 1550, as a portion of base matrix 1500, may constitute a core and necessary portion of every codebook generated or otherwise derived from base matrix 1500. That is, kernel matrix 1550 may constitute a smallest size among various sizes of codebooks that may be generated or otherwise derived from base matrix 1500. In other words, various codebooks of different sizes may be generated or otherwise derived from a portion or an entirety of base matrix 1500, with kernel matrix 1550 embedded in each of such codebooks.

Under the proposed scheme, with a codebook of a smallest size corresponding to kernel matrix 1550, any other codebook of a relatively larger size may include kernel matrix 1550 plus additional bits extended from kernel matrix 1550 in equal dimensions row-wise and column-wise. For instance, referring to FIG. 16, a smallest codebook (labeled as "codebook A" in FIG. 16) among various possible codebooks that can be derived from base matrix 1500 may correspond or otherwise equal to kernel matrix 1550. A slightly larger codebook (labeled as "codebook B" in FIG. 16) may correspond to a portion of base matrix 1500 that includes kernel matrix 1550 plus one row extended row-wise from kernel matrix 1550 and one column extended column-wise from kernel matrix 1550. The next slightly larger codebook (labeled as "codebook C" in FIG. 16) may correspond to a portion of base matrix 1500 that includes kernel matrix 1550 plus two rows extended row-wise from kernel matrix 1550 and two columns extended column-wise from kernel matrix 1550. The next slightly larger codebook (labeled as "codebook D" in FIG. 16) may correspond to a portion of base matrix 1500 that includes kernel matrix 1550 plus three rows extended row-wise from kernel matrix 1550 and three columns extended column-wise from kernel matrix 1550. A yet larger codebook (labeled as "codebook E" in FIG. 16) may correspond to a portion of base matrix 1500 that includes kernel matrix 1550 plus eight rows extended row-wise from kernel matrix 1550 and eight columns extended column-wise from kernel matrix 1550. A still larger codebook (labeled as "codebook F" in FIG. 16) may correspond to a portion of base matrix 1500 that includes kernel matrix 1550 plus eighteen rows extended row-wise from kernel matrix 1550 and eighteen columns extended column-wise from kernel matrix 1550. In this example, codebook F may correspond or otherwise equal to base matrix 1500. Under the proposed scheme, codebooks of even larger sizes may also be generated or otherwise derived from base matrix 1500 by extending equally row-wise and column-wise (e.g., by equal number of row(s) and column(s)) from base matrix 1500 to result in codebooks larger than base matrix 1500 (e.g., with more rows and columns than base matrix 1500).

In selecting one of the various codebooks that may be generated or otherwise derived from base matrix 1500, the one or more rules of logic flow 200 described above may be utilized for codebook selection such that a small codebook requiring a shorter amount of processing latency for the encoding is selected for the encoding unless a larger codebook corresponding to a larger amount of processing latency for the encoding is necessary for the encoding. For instance, depending on either or both of an initial code rate for transmission of data (e.g., packets) and a code block size of the data, one of the various codebooks of different sizes generated or otherwise derived from base matrix 1500 may be selected corresponding to the initial code rate and/or code block size.

Illustrative Implementations

Figure 10:
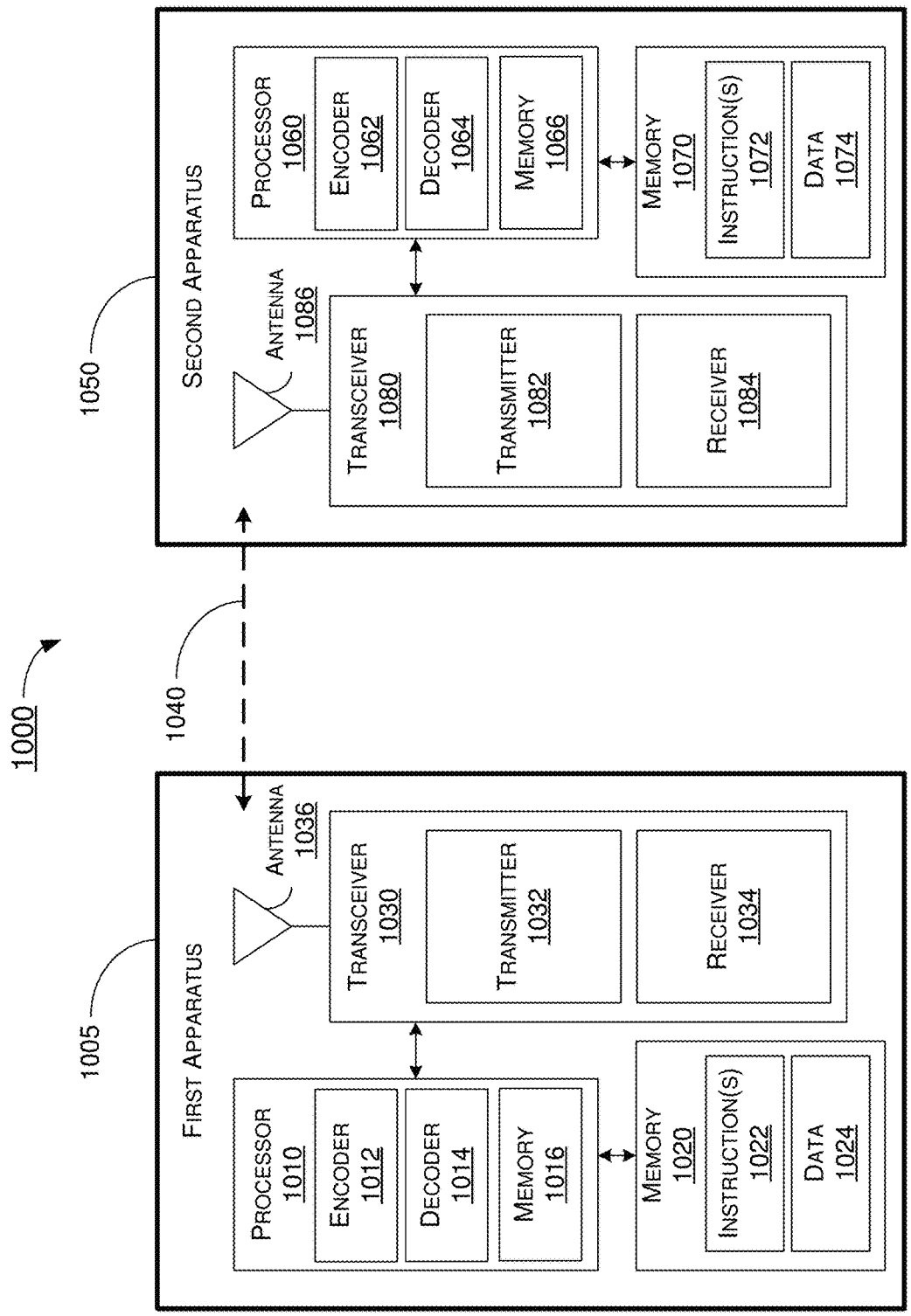
FIG. 10 is a block diagram of an example communications system in accordance with an implementation of the present disclosure.

FIG. 10 illustrates an example communications system 1000 in accordance with an implementation of the present disclosure. Communications systems may include a first apparatus 1005 and a second apparatus 1050, which may be in communications with each other via a communications link 1040. Communications link 1040 may be a wireless link in some implementations. Alternatively, communication link 1040 may be a wired link in some other implementations. In the context of 5G NR communications, communication link 1040 is a wireless communication link such as, for example, a multi-user multiple-input-and-multiple-output (MU-MIMO) communication link. Each of first apparatus 1005 and second apparatus 1050 may perform various functions as a communication device to implement concepts, schemes, techniques, processes and methods described herein pertaining to QC-LDPC coding, including those described with respect to some or all of FIG. 1-FIG. 9 as well as processes 1100, 1200 and 1300 described below. More specifically, each of first apparatus 1005 and second apparatus 1050 may implement various aspects of the proposed concepts and schemes pertaining to multi-codebook-embedded LDPC code design, hybrid orthogonal LDPC layer design, QC-LDPC support of extreme low code rate, base matrix design, kernel matrix design, and shift-coefficient design.

Each of first apparatus 1005 and second apparatus 1050 may be a part of an electronic apparatus which may be a communication device, a computing apparatus, a portable or mobile apparatus, or a wearable apparatus. For instance, first apparatus 1005 may be implemented in a Wi-Fi access point, a smartphone, a smartwatch, a smart bracelet, a smart necklace, a personal digital assistant, or a computing device such as a tablet computer, a laptop computer, a notebook computer, a desktop computer, or a server. Likewise, second apparatus 1050 may be implemented in a Wi-Fi mobile client or station, a smartphone, a smartwatch, a smart bracelet, a smart necklace, a personal digital assistant, or a computing device such as a tablet computer, a laptop computer, a notebook computer, a desktop computer, or a server. Alternatively, each of first apparatus 1005 and second apparatus 1050 may be implemented in the form of one or more integrated-circuit (IC) chips such as, for example and not limited to, one or more single-core processors, one or more multi-core processors, or one or more complex-instruction-set-computing (CISC) processors.

Each of first apparatus 1005 and second apparatus 1050 may include at least some of those components shown in FIG. 10, respectively. For instance, first apparatus 1005 may include at least a processor 1010, and second apparatus 1050 may include at least a processor 1060. Additionally, first apparatus 1005 may include a memory 1020, a transceiver 1030 and one or more antennas (represented by antenna 1036), with transceiver 1030 configured to transmit and receive data wirelessly (e.g., in compliance with one or more 3GPP stands, protocols, specifications and/or any applicable wireless protocols and standards such as 5G NR). Each of memory 1020 and transceiver 1030 may be communicatively and operably coupled to processor 1010. Similarly, second apparatus 1050 may also include a memory 1070, a transceiver 1080 and one or more antennas (represented by antenna 1086), with transceiver 1080 configured to transmit and receive data wirelessly (e.g., in compliance with one or more 3GPP stands, protocols, specifications and/or any applicable wireless protocols and standards such as 5G NR). Each of memory 1070 and transceiver 1080 may be communicatively and operably coupled to processor 1060. Each of first apparatus 1005 and second apparatus 1050 may further include other components (e.g., power system, display device and user interface device), which are not pertinent to the proposed scheme of the present disclosure and, thus, are neither shown in FIG. 10 nor described herein in the interest of simplicity and brevity.

Transceiver 1030 may be configured to communicate wirelessly in a single frequency band or multiple frequency bands. Transceiver 1030 may include a transmitter 1032 capable of transmitting data wirelessly and a receiver 1034 capable of receiving data wirelessly. In some implementations, transceiver 1030 may be capable of transmitting/modulating (via transmitter 1032) and receiving/demodulating (via receiver 1034) data symbols as orthogonal frequency-division multiplexed (OFDM) symbols that are radiated through antenna 1036. Likewise, transceiver 1080 may be configured to communicate wirelessly in a single frequency band or multiple frequency bands. Transceiver 1080 may include a transmitter 1082 capable of transmitting data wirelessly and a receiver 1084 capable of receiving data wirelessly. In some implementations, transceiver 1080 may be capable of transmitting/modulating (via transmitter 1082) and receiving/demodulating (via receiver 1084) data symbols as OFDM symbols that are radiated through antenna 1086.

Each of memory 1020 and memory 1070 may be a storage device configured to store one or more sets of codes, programs and/or instructions and/or data therein. In the example shown in FIG. 10, memory 1020 stores one or more sets of processor-executable instructions 1022 and data 1024 therein, and memory 1070 stores one or more sets of processor-executable instructions 1072 and data 1074 therein. Each of memory 1020 and memory 1070 may be implemented by any suitable technology and may include volatile memory and/or non-volatile memory. For example, each of memory 1020 and memory 1070 may include a type of random access memory (RAM) such as dynamic RAM (DRAM), static RAM (SRAM), thyristor RAM (T-RAM) and/or zero-capacitor RAM (Z-RAM). Alternatively or additionally, memory 520 may include a type of read-only memory (ROM) such as mask ROM, programmable ROM (PROM), erasable programmable ROM (EPROM) and/or electrically erasable programmable ROM (EEPROM). Alternatively or additionally, each of memory 1020 and memory 1070 may include a type of non-volatile random-access memory (NVRAM) such as flash memory, solid-state memory, ferroelectric RAM (FeRAM), magnetoresistive RAM (MRAM) and/or phase-change memory.

In one aspect, each of processor 1010 and processor 1060 may be implemented in the form of one or more single-core processors, one or more multi-core processors, or one or more CISC processors. That is, even though a singular term "a processor" is used herein to refer to each of processor 1010 and processor 1060, each of processor 1010 and processor 1060 may include multiple processors in some implementations and a single processor in other implementations in accordance with the present disclosure. In another aspect, each of processor 1010 and processor 1060 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 1010 and processor 1060 is a special-purpose machine specifically designed, arranged and configured to perform specific tasks including QC-LDPC coding in accordance with various implementations of the present disclosure.

Processor 1010, as a special-purpose machine, may include non-generic and specially-designed hardware circuits that are designed, arranged and configured to perform specific tasks pertaining to QC-LDPC coding in accordance with various implementations of the present disclosure. In one aspect, processor 1010 may execute the one or more sets of codes, programs and/or instructions 1022 stored in memory 1020 to perform various operations to render QC-LDPC coding in accordance with various implementations of the present disclosure. In another aspect, processor 1010 may include an encoder 1012 and a decoder 1014 that, together, perform specific tasks and functions to render QC-LDPC coding in accordance with various implementations of the present disclosure. For instance, encoder 1012 may be configured to encode data in accordance with various concepts and schemes of the present disclosure. Similarly, decoder 1014 may be configured to decode data in accordance with various concepts and schemes of the present disclosure.

In some implementations, processor 1010 may also include a memory 1016 which may include one or more registers, one or more buffers and/or one or more caches. In some implementations, memory 1016 may be utilized by processor 1016 to store a base matrix of QC-LDPC code (e.g., base matrix 1500), a selected codebook, lifting factor(s) and/or a shift-coefficient matrix. For instance, processor 1010 may generate base matrix 1500 and store it in memory 1020 and, upon selection of a codebook from the multiple codebooks embedded in base matrix 1500, processor 1010 may store the selected codebook in memory 1016. Thus, by selecting a codebook from multiple codebooks embedded in base matrix 1500 in accordance with the one or more rules of logic flow 200, processing latency for encoding may be shortened. Thus, by implementing various schemes in accordance with the present disclosure (e.g., encoding data for transmission by selecting a codebook from a plurality of codebooks embedded in a QC-LDPC code), not only the functioning of processor 1010 is improved (e.g., shorter processing latency) but the underlying technology of data encoding is also improved (e.g., shorter processing latency and improved decoder throughput efficiency).

Processor 1060, as a special-purpose machine, may include non-generic and specially-designed hardware circuits that are designed, arranged and configured to perform specific tasks pertaining to QC-LDPC coding in accordance with various implementations of the present disclosure. In one aspect, processor 1060 may execute the one or more sets of codes, programs and/or instructions 1072 stored in memory 1070 to perform various operations pertaining to QC-LDPC coding in accordance with various implementations of the present disclosure. In another aspect, processor 1060 may include an encoder 1062 and a decoder 1064 that performs specific tasks and functions to render QC-LDPC coding in accordance with various implementations of the present disclosure. For instance, encoder 1062 may be configured to encode data in accordance with various concepts and schemes of the present disclosure. Likewise, decoder 1064 may be configured to decode data in accordance with various concepts and schemes of the present disclosure.

In some implementations, processor 1060 may also include a memory 1066 which may include one or more registers, one or more buffers and/or one or more caches. In some implementations, memory 1066 may be utilized by processor 1066 to store a base matrix of QC-LDPC code (e.g., base matrix 1500), a selected codebook, lifting factor(s) and/or a shift-coefficient matrix. For instance, processor 1060 may generate base matrix 1500 and store it in memory 1070 and, upon selection of a codebook from the multiple codebooks embedded in base matrix 1500, processor 1060 may store the selected codebook in memory 1066. Thus, by selecting a codebook from multiple codebooks embedded in base matrix 1500 in accordance with the one or more rules of logic flow 200, processing latency for encoding may be shortened.

Each of encoder 1012 and encoder 1062 may be configured with electronic components that operate as an encoding chain to perform a number of operations pertaining to encoding. For instance, the encoding chain in each of encoder 1012 and encoder 1062 may perform the following: bit reordering, tone interleaving, hybrid redundancy version (RV) design, adaptive HARQ buffering, and code block grouping. Each of decoder 1014 and decoder 1064 may be configured to support various code rates of codebooks. The lowest code rate of a codebook supported by each of decoder 1014 and decoder 1064 may depend on the size of the corresponding lifting factor. Under the proposed scheme, an upper limit on the size of a log-likelihood ratio (LLR) memory may be set. As lifting factor(s) may be stored in the LLR memory, the size of the LLR memory may define or otherwise limit how large the size of lifting factors can be. Accordingly, by setting the upper limit on the size of the LLR memory, the maximum size of a lifted parity check matrix generated from a base matrix may be set, thereby setting an upper limit on the size of memory needed to store the lifted parity check matrix. In first apparatus 1005, the LLR memory may be implemented by utilizing one or more registers, one or more buffers, one or more caches and/or one or more memory cells in processor 1010 (e.g., memory 1016) or in memory 1020. In second apparatus 1050, the LLR memory may be implemented by utilizing one or more registers, one or more buffers, one or more caches and/or one or more memory cells in processor 1060 (e.g., memory 1066) or in memory 1070.

In operation, for a forward link on the transmitting (TX) side, encoder 1012 may receive a packet of data from a data source, process the data by performing encoding, interleaving and symbol mapping on the data, and provide modulation symbols of the encoded data. Transmitter 1032 may multiplex the modulation symbols with pilot symbols, perform spatial processing and provide one or more output symbol streams. Transmitter 1032 (which may include one or more transmitters) may also condition the one or more output symbol streams by performing digital-to-analog conversion, filtering, amplification and up-conversion to generate one or more forward link signals that are radiated as electromagnetic waves through one or more antennas of antenna 1036. On the receiving (RX) side, receiver 1084 (which may include one or more receivers) may receive the one or more forward link signals as electromagnetic waves via one or more antennas of antenna 1086. Receiver 1084 may process the received signal(s) by performing filtering, amplification, down-conversion and analog-to-digital conversion to obtain samples. Receiver 1084 may also process the samples to obtain received symbols and perform multiple-input-and-multiple-output (MIMO) detection on the received symbols to provide detected symbols. Decoder 1064 may process the detected symbols by performing symbol de-mapping, deinterleaving and decoding to provide decoded data to a data sink.

Similarly, on a reverse link, encoder 1062 may receive a packet of data from a data source and process the data by performing encoding, interleaving and symbol mapping to provide modulation symbols of the encoded data. Transmitter 1082 may multiplex the modulation symbols with pilot symbols, perform spatial processing and provide one or more output symbol streams. Transmitter 1082 (which may include one or more transmitters) may also condition the one or more output symbol streams by performing digital-to-analog conversion, filtering, amplification and up-conversion to generate one or more reverse link signals that are radiated as electromagnetic waves through one or more antennas of antenna 1086. On the RX side, receiver 1034 (which may include one or more receivers) may receive the one or more reverse link signals as electromagnetic waves via one or more antennas of antenna 1036. Receiver 1034 may process the received signal(s) by performing filtering, amplification, down-conversion and analog-to-digital conversion to obtain samples. Receiver 1034 may also process the samples to obtain received symbols and perform MIMO detection on the received symbols to provide detected symbols. Decoder 1014 may process the detected symbols by performing symbol de-mapping, deinterleaving and decoding to recover the data transmitted by second apparatus 1050.

Processor 1010 may be configured to control or otherwise direct operations of first apparatus 1005. Processor 1060 may be configured to control or otherwise direct operations of first apparatus 1050. Processor 1010 may be capable of determining the size of packets to be transmitted and/or received and, correspondingly, control encoding by encoder 1012 and decoding by decoder 1014, respectively, in accordance with schemes and concepts of the present disclosure. Likewise, processor 1060 may be capable of determining the size of packets to be transmitted and/or received and, correspondingly, control encoding by encoder 1062 and decoding by decoder 1064, respectively, in accordance with schemes and concepts of the present disclosure. For instance, each of processor 1010 and processor 1060 may be configured to select a codebook from multiple codebooks embedded in a base matrix of a QC-LDPC code for encoding such that a small codebook requiring a shorter amount of processing latency for the encoding is selected for the encoding unless a larger codebook corresponding to a larger amount of processing latency for the encoding is necessary for the encoding.

Each of first apparatus 1005 and second apparatus 1050 may be configured to implement each of processes 1100, 1200, 1300, 1700 and 1800 described below. Thus, to avoid redundancy and in the interest of brevity, operations of first apparatus 1005 and second apparatus 1050, as well as processor 1010 and processor 1060, are described below in the context of processes 1100, 1200, 1300, 1700 and 1800. It is noteworthy that, although the description below is provided in the context of first apparatus 1005, the description below is also applicable to second apparatus 1050.

Illustrative Processes

Figure 11:
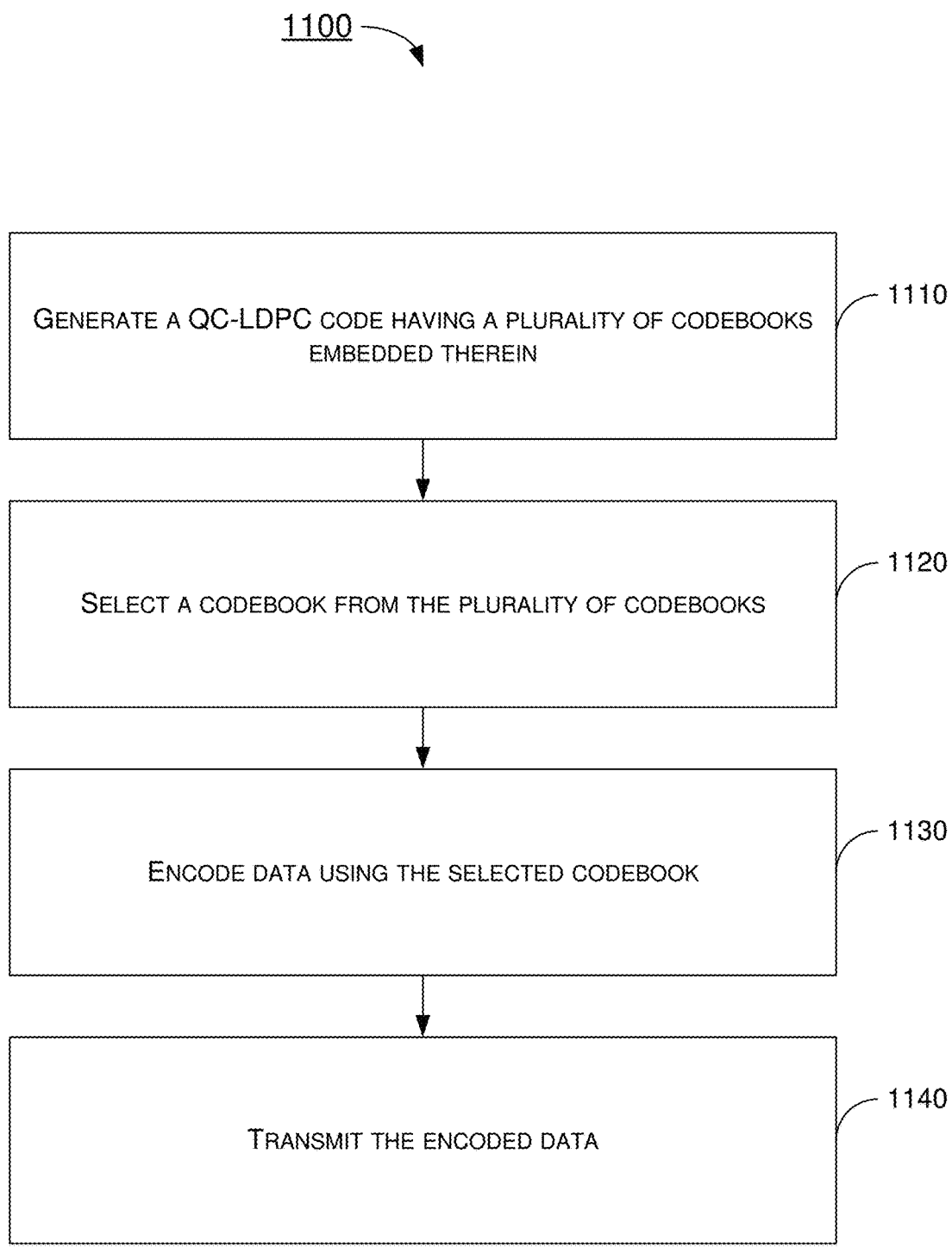
FIG. 11 is a flowchart of an example process in accordance with an implementation of the present disclosure.

FIG. 11 illustrates an example process 1100 in accordance with an implementation of the present disclosure. Process 1100 may represent an aspect of implementing the proposed concepts and schemes such as those described with respect to some or all of FIG. 1-FIG. 10. More specifically, process 1100 may represent an aspect of the proposed concepts and schemes pertaining to QC-LDPC coding. Process 1100 may include one or more operations, actions, or functions as illustrated by one or more of blocks 1110, 1120, 1130 and 1140. Although illustrated as discrete blocks, various blocks of process 1100 may be divided into additional blocks, combined into fewer blocks, or eliminated, depending on the desired implementation. Moreover, the blocks/sub-blocks of process 1100 may be executed in the order shown in FIG. 11 or, alternatively in a different order. Process 1100 may be implemented by communications system 1000 and any variations thereof. For instance, process 1100 may be implemented in or by first apparatus 1005 and/or second apparatus 1050. Solely for illustrative purposes and without limiting the scope, process 1100 is described below in the context of first apparatus 1005. Process 1100 may begin at block 1110.

At 1110, process 1100 may involve processor 1010 of first apparatus 1005 generating a QC-LDPC code having a plurality of codebooks embedded therein. Process 1100 may proceed from 1110 to 1120.

At 1120, process 1100 may involve processor 1010 selecting a codebook from the plurality of codebooks. Process 1100 may proceed from 1120 to 1130.

At 1130, process 1100 may involve processor 1010 encoding data using the selected codebook. Process 1100 may proceed from 1130 to 1140.

At 1140, process 1100 may involve processor 1010 transmitting, via transceiver 1030, the encoded data (e.g., to second apparatus 1050).

In some implementations, each codebook of the plurality of codebooks may correspond to a respective HARQ threads of a plurality of HARQ threads that are different from one another. For instance, process 1100 may involve processor 1010 communicating with processor 1060 of second apparatus 1050 using HARQ. In selecting the codebook from the plurality of codebooks, process 1100 may involve processor 1010 performing the following: (1) correlating or otherwise associating each HARQ thread of the plurality of HARQ threads to a respective codebook of the plurality of codebooks; (2) identifying a HARQ thread that is currently utilized in communicating with second apparatus 1050; and (3) selecting one of the codebooks that corresponds to the identified HARQ thread. The selected codebook may be utilized in encoding the data to be transmitted to second apparatus 1050.

In some implementations, in generating the QC-LDPC code having the plurality of codebooks embedded therein, process 1100 may involve processor 1010 generating the QC-LDPC code which includes a base matrix and a shift-coefficient matrix. The base matrix may include a parity matrix of a plurality of parity bits and an information matrix of a plurality of information bits. Each codebook of the plurality of codebooks may include the parity matrix and a respective portion of the information matrix of a corresponding size such that sizes of the plurality of codebooks are different from one another.

In some implementations, each codebook of the plurality of codebooks may correspond to a respective design of a plurality of designs of the shift-coefficient matrix.

In some implementations, in generating the QC-LDPC code having the plurality of codebooks embedded therein, process 1100 may involve processor 1010 generating a respective table of shift values for each lifting factor of a first set of lifting factors. Moreover, process 1100 may involve processor 1010 optimizing the first set of lifting factors to produce a second set of lifting factors. The number of lifting factors of the first set may be greater than a number of lifting factors of the second set. A first lifting factor that exists in the first set but not in the second set may share a respective table of shift values of a second lifting factor that exists in both the first set and the second set. The second lifting factor may be smaller than the first lifting factor in value and closest to the first lifting factor than other lifting factors in the first set.

In some implementations, in selecting the codebook from the plurality of codebooks, process 1100 may involve processor 1010 selecting the codebook from the plurality of codebooks based on an initial code rate for transmission of the data, a code block size of the data, or both.

In some implementations, in selecting the codebook from the plurality of codebooks, process 1100 may involve processor 1010 performing a number of operations (e.g., similar to those involved in logic flow 200). For instance, process 1100 may involve processor 1010 determining whether a code block size of the data is less than a threshold code block size. In response to the code block size of the data being less than the threshold code block size, process 1100 may involve processor 1010 selecting a third codebook of the plurality of codebooks. In response to the code block size of the data being not less than the threshold code block size, process 1100 may involve processor 1010 determining whether an initial code rate for transmission of the data is greater than a threshold code rate. In response to the initial code rate being not greater than the threshold code rate, process 1100 may involve processor 1010 selecting a second codebook of the plurality of codebooks. In response to the initial code rate being greater than the threshold code rate, process 1100 may involve processor 1010 selecting a first codebook of the plurality of codebooks. A size of the first codebook may be larger than a size of the second codebook. The size of the second codebook may be larger than a size of the third codebook.

Alternatively or additionally, in selecting the codebook from the plurality of codebooks, process 1100 may involve processor 1010 performing a number of other operations. For instance, process 1100 may involve processor 1010 determining a code block size of the data. Based on a result of the determination, process 1100 may involve processor 1010 selecting a first codebook of the plurality of codebooks responsive to the code block size being determined to be greater than a first threshold code block size. Additionally, process 1100 may involve processor 1010 selecting a second codebook of the plurality of codebooks responsive to the code block size being determined to be greater than a second threshold code block size. Moreover, process 1100 may involve processor 1010 selecting a third codebook of the plurality of codebooks responsive to the code block size being determined to be greater than a third threshold code block size. The first threshold code block size may be greater than the second threshold code block size. The second threshold code block size may be greater than the third threshold code block size. A size of the first codebook may be larger than a size of the second codebook. The size of the second codebook may be larger than a size of the third codebook.

Figure 12:
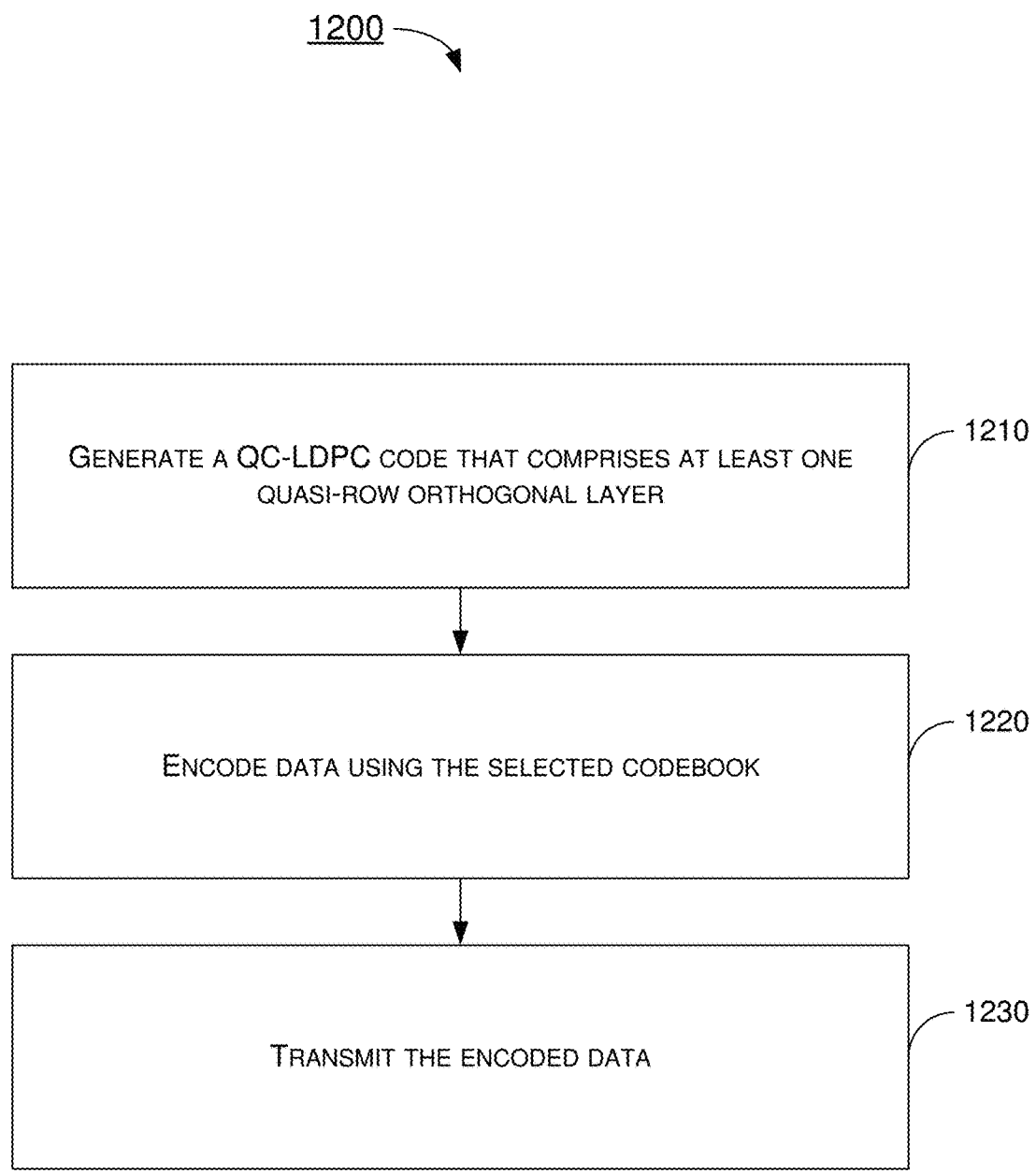
FIG. 12 is a flowchart of an example process in accordance with another implementation of the present disclosure.

FIG. 12 illustrates an example process 1200 in accordance with an implementation of the present disclosure. Process 1200 may represent an aspect of implementing the proposed concepts and schemes such as those described with respect to some or all of FIG. 1-FIG. 10. More specifically, process 1200 may represent an aspect of the proposed concepts and schemes pertaining to hybrid orthogonal LDPC layer design and QC-LDPC support of extreme low code rate. Process 1200 may include one or more operations, actions, or functions as illustrated by one or more of blocks 1210, 1220 and 1230. Although illustrated as discrete blocks, various blocks of process 1200 may be divided into additional blocks, combined into fewer blocks, or eliminated, depending on the desired implementation. Moreover, the blocks/sub-blocks of process 1200 may be executed in the order shown in FIG. 12 or, alternatively in a different order. Process 1200 may be implemented by communications system 1000 and any variations thereof. For instance, process 1200 may be implemented in or by first apparatus 1005 and/or second apparatus 1050. Solely for illustrative purposes and without limiting the scope, process 1200 is described below in the context of first apparatus 1005. Process 1200 may begin at block 1210.

At 1210, process 1200 may involve processor 1010 of first apparatus 1005 generating a QC-LDPC code that comprises at least one quasi-row orthogonal layer. Process 1200 may proceed from 1210 to 1220.

At 1220, process 1200 may involve processor 1010 encoding data using the QC-LDPC code. Process 1200 may proceed from 1220 to 1230.

At 1230, process 1200 may involve processor 1010 transmitting, via transceiver 1030, the encoded data (e.g., to second apparatus 1050).

In some implementations, the at least one quasi-row orthogonal layer may include a plurality of rows and a plurality of columns of bits. One or more columns of the plurality of columns of the at least one quasi-row orthogonal layer may include at least one punctured column of degree two or more. The remaining columns of the plurality of columns of the at least one quasi-row orthogonal layer may include non-punctured columns of degree one or zero.

In some implementations, there may be no cycle within the punctured columns.

In some implementations, the QC-LDPC code may include a hybrid orthogonality design having a plurality of portions of different degrees of orthogonality. A first portion of the plurality of portions of a low degree of orthogonality may correspond to a high code rate, and a second portion of the plurality of portions of a high degree of orthogonality may correspond to a low code rate.

In some implementations, the plurality of portions of different degrees of orthogonality may include some or all of the following: (1) a non-row orthogonal portion comprising a plurality of rows and a plurality of columns forming at least one non-row orthogonal layer, (2) a quasi-row orthogonal portion comprising a plurality of rows and a plurality of columns forming the at least one quasi-row orthogonal layer, and (3) a pure-row orthogonal portion comprising a plurality of rows and a plurality of columns forming at least one pure-row orthogonal layer. The plurality of columns of the non-row orthogonal portion may include at least one punctured column of degree two or more as well as non-punctured columns of degree one or zero. One or more columns of the plurality of columns of the quasi-row orthogonal portion may include at least one punctured column of degree two or more. The remaining columns of the plurality of columns of the quasi-row orthogonal portion may include non-punctured columns of degree one or zero. Each column of the plurality of columns of the pure-row orthogonal portion may include a column of degree one or zero.

In some implementations, the QC-LDPC code may include a parity matrix of a plurality of parity bits and an information matrix of a plurality of information bits. One or more rows of bits through the information matrix and the parity matrix may include one or more rows of bits each of degree two.

In some implementations, each bit of bits of the degree two of the one or more rows of bits of degree two may include a previously-used parity bit or a previously-transmitted information bit.

Figure 13:
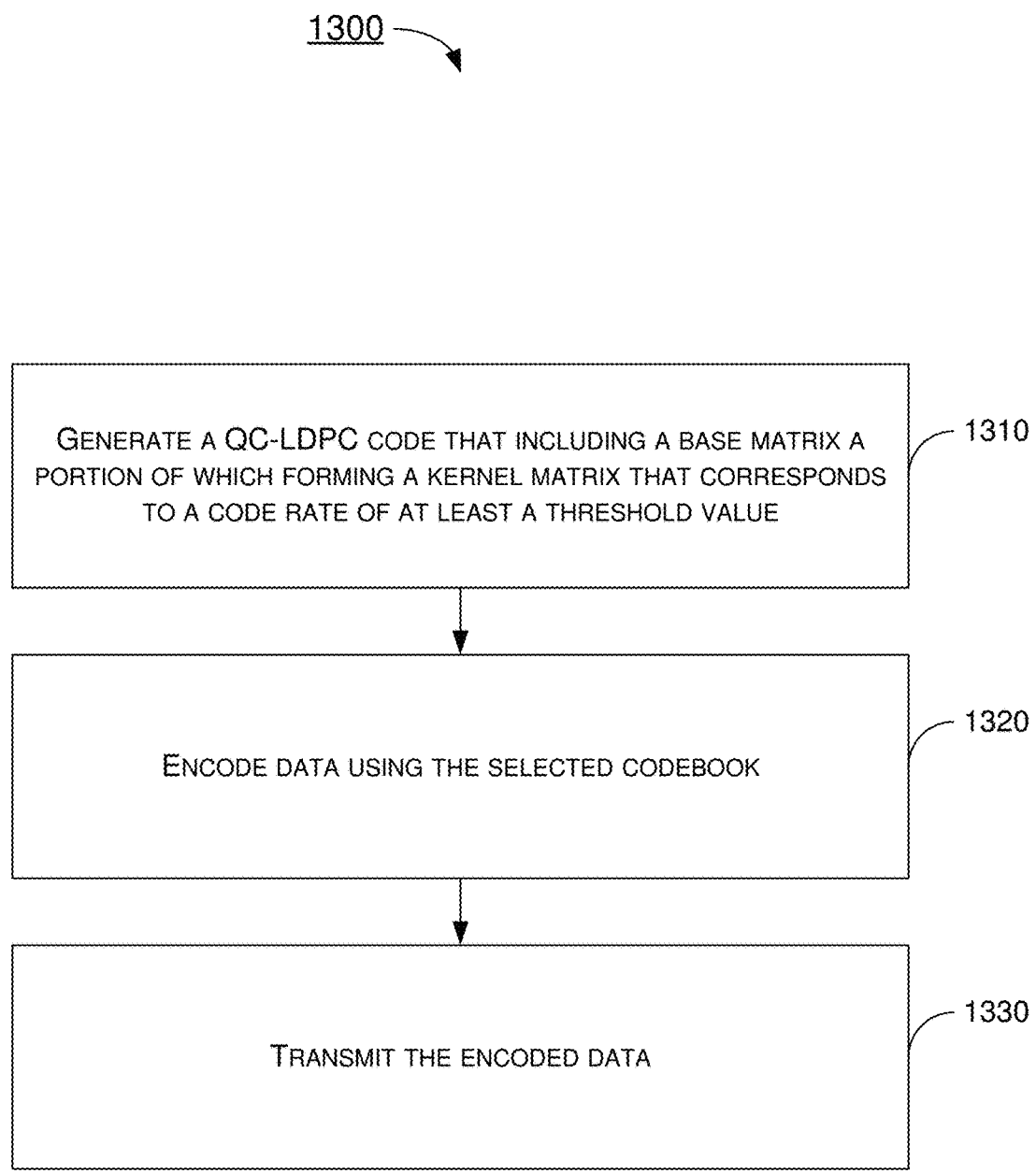
FIG. 13 is a flowchart of an example process in accordance with another implementation of the present disclosure.

FIG. 13 illustrates an example process 1300 in accordance with an implementation of the present disclosure. Process 1300 may represent an aspect of implementing the proposed concepts and schemes such as those described with respect to some or all of FIG. 1-FIG. 10. More specifically, process 1300 may represent an aspect of the proposed concepts and schemes pertaining to kernel matrix design. Process 1300 may include one or more operations, actions, or functions as illustrated by one or more of blocks 1310, 1320 and 1330. Although illustrated as discrete blocks, various blocks of process 1300 may be divided into additional blocks, combined into fewer blocks, or eliminated, depending on the desired implementation. Moreover, the blocks/sub-blocks of process 1300 may be executed in the order shown in FIG. 13 or, alternatively in a different order. Process 1300 may be implemented by communications system 1000 and any variations thereof. For instance, process 1300 may be implemented in or by first apparatus 1005 and/or second apparatus 1050. Solely for illustrative purposes and without limiting the scope, process 1300 is described below in the context of first apparatus 1005. Process 1300 may begin at block 1310.

At 1310, process 1300 may involve processor 1010 of first apparatus 1005 generating a QC-LDPC code that including a base matrix a portion of which forming a kernel matrix that corresponds to a code rate of at least a threshold value. Process 1300 may proceed from 1310 to 1320.

At 1320, process 1300 may involve processor 1010 encoding data using the QC-LDPC code. Process 1300 may proceed from 1320 to 1330.

At 1330, process 1300 may involve processor 1010 transmitting, via transceiver 1030, the encoded data (e.g., to second apparatus 1050).

In some implementations, the code rate may be 0.89.

In some implementations, the kernel matrix may include a plurality of rows and a plurality of columns of bits. Two or more of the columns may include punctured columns having a specific pattern of bits.

In some implementations, the specific pattern of bits in the punctured columns may include one or more bits of 0 within the punctured columns after any number of column permutation(s) and/or row permutation(s) (e.g., at least one column permutation, at least one row permutation, or any combination thereof). Two examples of a specific pattern including one or more bits of 0 after column permutation(s) and/or row permutation(s) are shown in part (A) of FIG. 7. In some implementations, the specific pattern of bits in the punctured columns may include an isosceles right triangle of bits of 0, with a right angle of the triangle corresponding to a bit of 0 at an upper-left corner of the punctured columns. An example of such an isosceles right triangle of bits of 0 is shown in part (B) of FIG. 7.

In some implementations, the kernel matrix may include a parity matrix of a plurality of rows and a plurality of columns of bits. The kernel matrix may also include an information matrix of a plurality of rows and a plurality of columns of bits. The parity matrix may include a matrix having a Wi-Fi pattern. More than one rows of bits of the information matrix excluding punctured columns of the kernel matrix may include rows of high density of bits of 1 with no or one bit of 0. The rows of high density bits may correspond to rows of the Wi-Fi pattern.

In some implementations, a bottom row of bits of the plurality of rows may include a first number of bits of 1. The first number may be equal to or greater than a number of punctured columns by zero, one, two or three (e.g., by a few). In some implementations, a portion of the first number of bits of 1 in the bottom row may correspond to the punctured columns and a right-most column of the kernel matrix bordering a right side of the Wi-Fi pattern.

In some implementations, the kernel matrix may include five rows of bits and twenty columns of bits. A variable node degree of the twenty columns of bits may include one of the following: [2, 2, 2, 2, 2, 3, 3, 3, 3, 3, 3, 3, 3, 3, 3, 3, 3, 3, 3, 3], [2, 2, 2, 2, 3, 3, 3, 3, 3, 3, 3, 3, 3, 3, 3, 3, 3, 3, 3, 3], [2, 2, 2, 3, 3, 3, 3, 3, 3, 3, 3, 3, 3, 3, 3, 3, 3, 3, 3, 3], and [2, 2, 3, 3, 3, 3, 3, 3, 3, 3, 3, 3, 3, 3, 3, 3, 3, 3, 3, 3]. A check node degree of the five rows of bits may include one of the following: [13, 10, 14, 17, 2], [13, 10, 13, 17, 2], [13, 10, 13, 18, 3], [13, 11, 13, 18, 2], [13, 10, 14, 18, 2], [13, 10, 13, 19, 2], [14, 10, 13, 18, 1], [13, 11, 13, 18, 1], [13, 10, 14, 18, 1], [13, 11, 13, 19, 1], [13, 10, 13, 18, 2], and [13, 10, 13, 18, 1].

Figure 14:
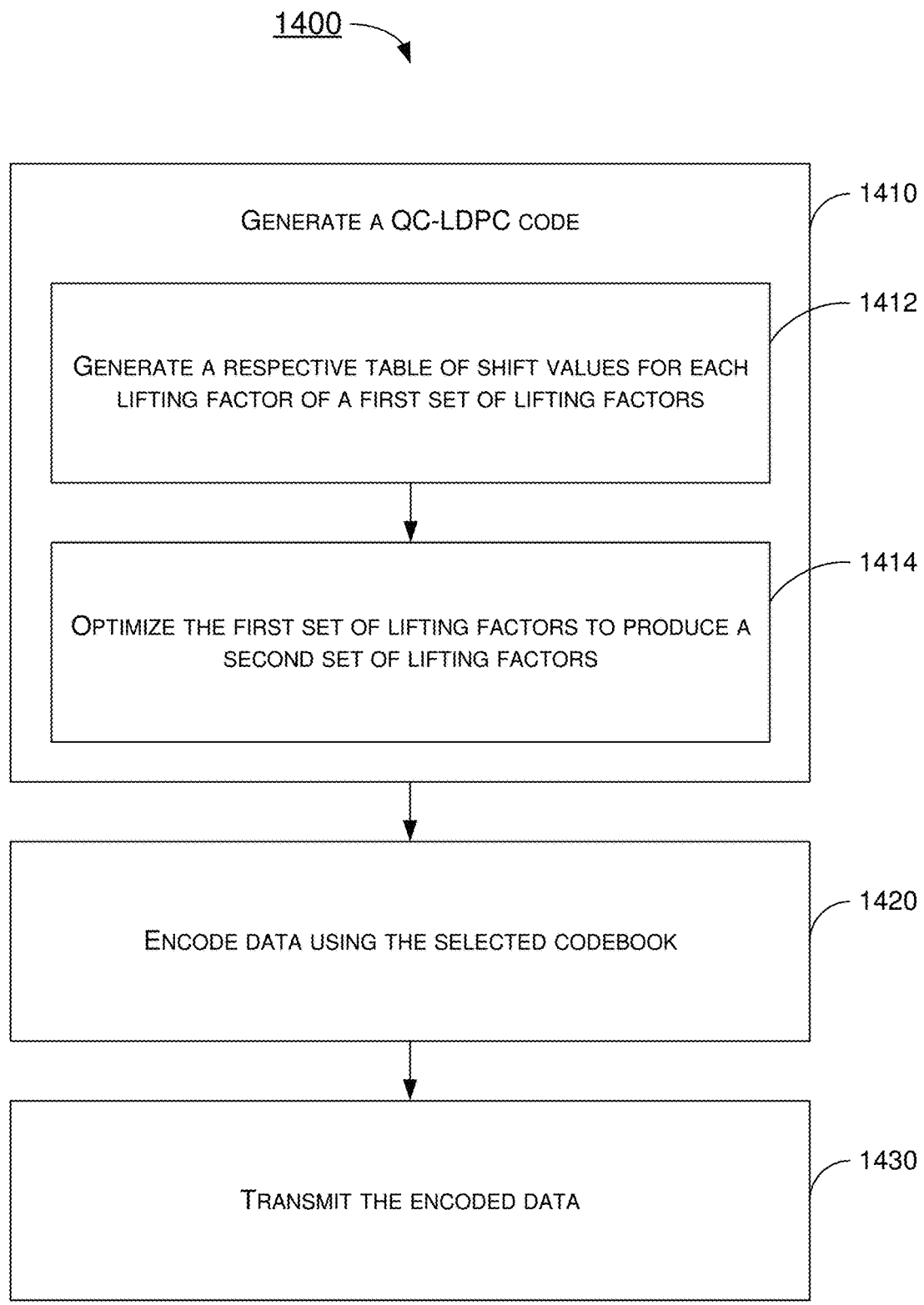
FIG. 14 is a flowchart of an example process in accordance with another implementation of the present disclosure.

FIG. 14 illustrates an example process 1400 in accordance with an implementation of the present disclosure. Process 1400 may represent an aspect of implementing the proposed concepts and schemes such as those described with respect to FIG. 9. More specifically, process 1300 may represent an aspect of the proposed concepts and schemes pertaining to shift-coefficient design. Process 1400 may include one or more operations, actions, or functions as illustrated by one or more of blocks 1410, 1420 and 1430 as well as sub-blocks 1412 and 1414. Although illustrated as discrete blocks, various blocks of process 1400 may be divided into additional blocks, combined into fewer blocks, or eliminated, depending on the desired implementation. Moreover, the blocks/sub-blocks of process 1400 may be executed in the order shown in FIG. 14 or, alternatively in a different order. Process 1400 may be implemented by communications system 1000 and any variations thereof. For instance, process 1400 may be implemented in or by first apparatus 1005 and/or second apparatus 1050. Solely for illustrative purposes and without limiting the scope, process 1400 is described below in the context of first apparatus 1005. Process 1400 may begin at block 1410.

At 1410, process 1400 may involve processor 1010 of first apparatus 1005 generating a QC-LDPC code. Process 1400 may proceed from 1410 to 1420.

At 1420, process 1400 may involve processor 1010 encoding data using the QC-LDPC code. Process 1400 may proceed from 1420 to 1430.

At 1430, process 1400 may involve processor 1010 transmitting, via transceiver 1030, the encoded data (e.g., to second apparatus 1050).

In generating the QC-LDPC code, process 1400 may involve processor 1010 performing a number of operations as represented by sub-blocks 1412 and 1414.

At 1412, process 1400 may involve processor 1010 generating a respective table of shift values for each lifting factor of a first set of lifting factors. Process 1400 may proceed from 1412 to 1414.

At 1414, process 1400 may involve processor 1010 optimizing the first set of lifting factors to produce a second set of lifting factors.

A number of lifting factors of the first set may be greater than a number of lifting factors of the second set. A first lifting factor that exists in the first set but not in the second set may share a respective table of shift values of a second lifting factor that exists in both the first set and the second set. The second lifting factor may be smaller than the first lifting factor in value and closest to the first lifting factor than other lifting factors in the first set.

Figure 17:
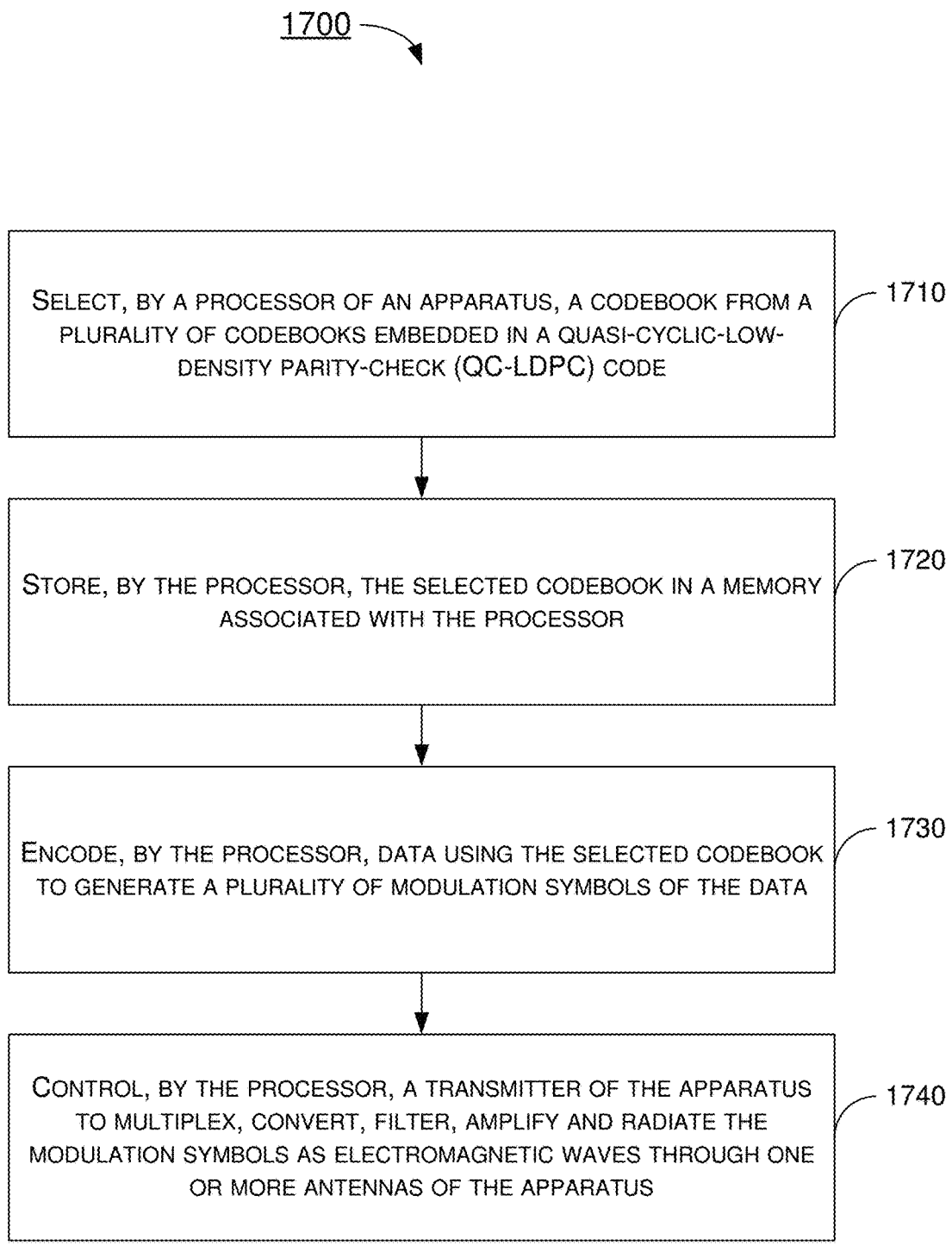
FIG. 17 is a flowchart of an example process in accordance with another implementation of the present disclosure.

FIG. 17 illustrates an example process 1700 of wireless communication in accordance with an implementation of the present disclosure. Process 1700 may represent an aspect of implementing the proposed concepts and schemes such as those described with respect to some or all of FIG. 1-FIG. 10, FIG. 15 and FIG. 16. More specifically, process 1700 may represent an aspect of the proposed concepts and schemes pertaining to a base matrix of QC-LDPC code for QC-LDPC coding. Process 1700 may include one or more operations, actions, or functions as illustrated by one or more of blocks 1710, 1720, 1730 and 1740. Although illustrated as discrete blocks, various blocks of process 1700 may be divided into additional blocks, combined into fewer blocks, or eliminated, depending on the desired implementation. Moreover, the blocks/sub-blocks of process 1700 may be executed in the order shown in FIG. 17 or, alternatively in a different order. Process 1700 may be implemented by communications system 1000 and any variations thereof. For instance, process 1700 may be implemented in or by first apparatus 1005 and/or second apparatus 1050. Solely for illustrative purposes and without limiting the scope, process 1700 is described below in the context of first apparatus 1005, although the same also applies to apparatus 1050. Process 1700 may begin at block 1710.

At 1710, process 1700 may involve processor 1010 of apparatus 1005 selecting a codebook from a plurality of codebooks embedded in a QC-LDPC code. Process 1700 may proceed from 1710 to 1720.

At 1720, process 1700 may involve processor 1010 storing the selected codebook in a memory associated with processor 1010 (e.g., memory 1016 or memory 1020). Process 1700 may proceed from 1720 to 1730.

At 1730, process 1700 may involve encoder 1012 of processor 1010 encoding data (e.g., outgoing packets of data) using the selected codebook to generate a plurality of modulation symbols of the data. Process 1700 may proceed from 1730 to 1740.

At 1740, process 1700 may involve processor 1010 controlling transmitter 1032 of transceiver 1030 of apparatus 1005 to multiplex, convert, filter, amplify and radiate the modulation symbols as electromagnetic waves through one or more antennas of antenna 1036 of apparatus 1005.

In some implementations, in selecting the codebook from the plurality of codebooks embedded in the QC-LDPC code, process 1700 may involve processor 1010 selecting the codebook according to one or more rules such that a small codebook requiring a shorter amount of processing latency for the encoding is selected for the encoding unless a larger codebook corresponding to a larger amount of processing latency for the encoding is necessary for the encoding.

In some implementations, the QC-LDPC code may include a kernel matrix (e.g., kernel matrix 1550). The kernel matrix may be formed by null bits and non-null bits arranged in four rows and fourteen columns in a pattern as follows:
Row 1: 11110010011100
Row 2: 10011111110110
Row 3: 11011000101011
Row 4: 01101111111001

In some implementations, each codebook of the plurality of codebooks may include the kernel matrix plus an additional of Q rows and Q columns, and wherein Q is either zero or a positive integer greater than zero.

In some implementations, the QC-LDPC code may include a base matrix (e.g., base matrix 1500) with the kernel matrix (e.g., kernel matrix 1550) being a portion thereof. Moreover, the base matrix may be formed by null bits and non-null bits arranged in twenty-two rows and thirty-two columns in a pattern as follows:
Row 1: 11110010011100000000000000000000
Row 2: 10011111110110000000000000000000
Row 3: 11011000101011000000000000000000
Row 4: 01101111111001000000000000000000
Row 5: 11000000000100100000000000000000
Row 6: 11000101000100010000000000000000
Row 7: 10000101010100001000000000000000
Row 8: 01000101000101000100000000000000
Row 9: 11000000000010000010000000000000
Row 10: 01000000101100000001000000000000
Row 11: 11000011000000000000100000000000
Row 12: 10000001010001000000010000000000
Row 13: 01010000000100000000001000000000
Row 14: 11000000010000100000000100000000
Row 15: 01000010000101000000000010000000
Row 16: 10000000000110000000000001000000
Row 17: 01000000010110000000000000100000
Row 18: 01000100000110000000000000010000
Row 19: 10000011000000000000000000001000
Row 20: 11000000001000000000000000000100
Row 21: 01001000000100000000000000000010
Row 22: 10000000010001000000000000000001

In some implementations, each codebook of the plurality of codebooks may correspond to a respective hybrid automatic repeat request (HARQ) threads of a plurality of HARQ threads that are different from one another.

In some implementations, in selecting the codebook from the plurality of codebooks, process 1700 may involve processor 1010 selecting the codebook from the plurality of codebooks based on an initial code rate for transmission of the data, a code block size of the data, or both.

In some implementations, in selecting the codebook from the plurality of codebooks, process 1700 may involve processor 1010 performing a number of operations. For instance, process 1700 may involve processor 1010 performing the following (e.g., in accordance with logic flow 200): (1) determining whether a code block size of the data is less than a threshold code block size; (2) responsive to the code block size of the data being less than the threshold code block size, selecting a third codebook of the plurality of codebooks; (3) responsive to the code block size of the data being not less than the threshold code block size, determining whether an initial code rate for transmission of the data is greater than a threshold code rate; (4) responsive to the initial code rate being not greater than the threshold code rate, selecting a second codebook of the plurality of codebooks; and (5) responsive to the initial code rate being greater than the threshold code rate, selecting a first codebook of the plurality of codebooks. In some implementation, a size of the first codebook may be larger than a size of the second codebook. Moreover, the size of the second codebook may be larger than a size of the third codebook.

In some implementations, in selecting the codebook from the plurality of codebooks, process 1700 may involve processor 1010 performing a number of operations. For instance, process 1700 may involve processor 1010 determining a code block size of the data. Additionally, process 1700 may involve processor 1010 selecting the codebook by performing the following: (1) selecting a first codebook of the plurality of codebooks responsive to the code block size being determined to be greater than a first threshold code block size; (2) selecting a second codebook of the plurality of codebooks responsive to the code block size being determined to be greater than a second threshold code block size; and (3) selecting a third codebook of the plurality of codebooks responsive to the code block size being determined to be greater than a third threshold code block size. In some implementations, the first threshold code block size may be greater than the second threshold code block size. In some implementations, the second threshold code block size may be greater than the third threshold code block size. In some implementations, a size of the first codebook may be larger than a size of the second codebook. In some implementations, the size of the second codebook may be larger than a size of the third codebook.

In some implementations, process 1700 may further involve processor 1010 generating the QC-LDPC code that comprises a base matrix and a shift-coefficient matrix. In some implementations, the base matrix may include a parity matrix of a plurality of parity bits and an information matrix of a plurality of information bits. In some implementations, each codebook of the plurality of codebooks may include the parity matrix and a respective portion of the information matrix of a corresponding size such that sizes of the plurality of codebooks are different from one another.

In some implementations, each codebook of the plurality of codebooks may correspond to a respective design of a plurality of designs of the shift-coefficient matrix.

Figure 18:
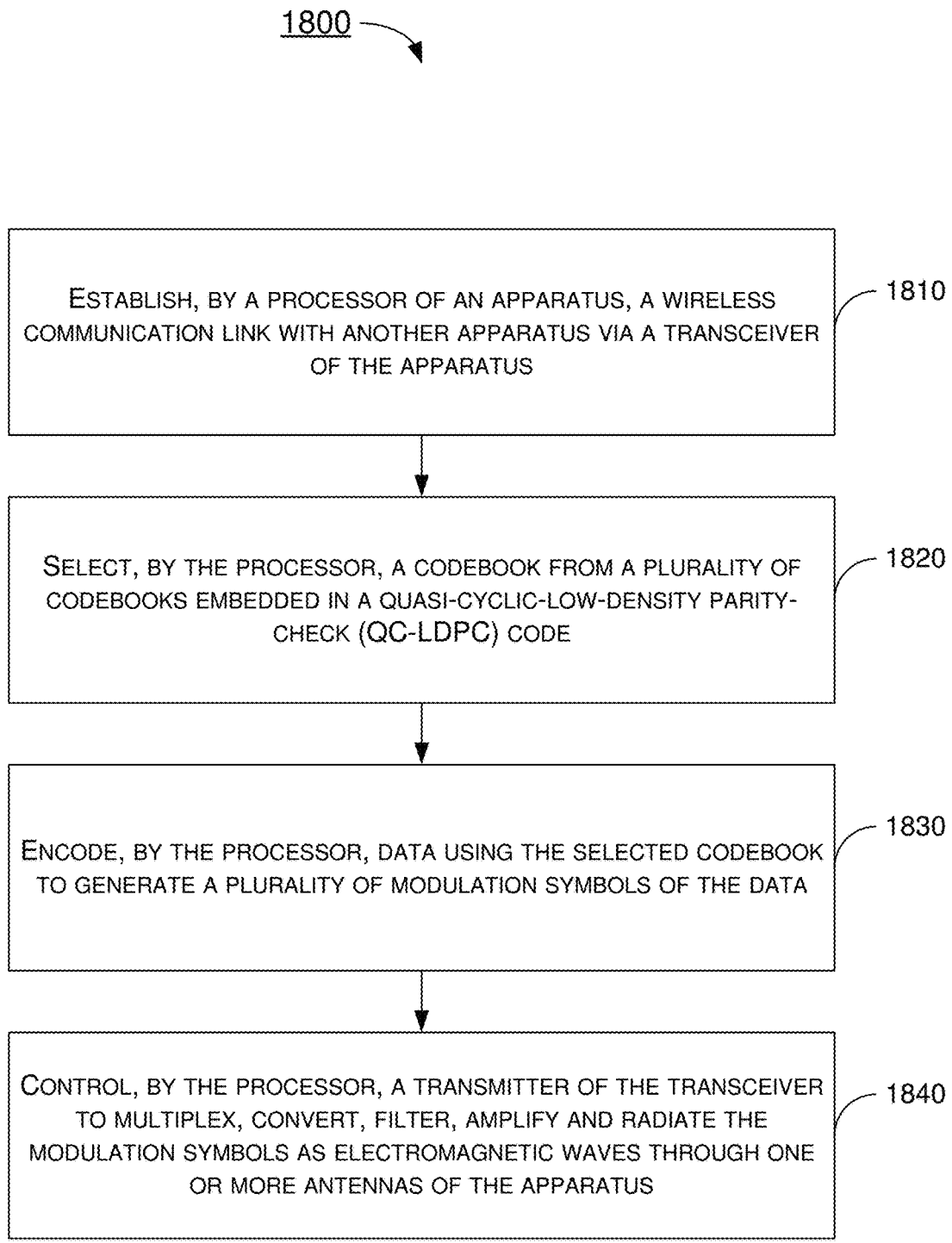
FIG. 18 is a flowchart of an example process in accordance with another implementation of the present disclosure.

FIG. 18 illustrates an example process 1800 of wireless communication in accordance with an implementation of the present disclosure. Process 1800 may represent an aspect of implementing the proposed concepts and schemes such as those described with respect to some or all of FIG. 1-FIG. 10, FIG. 15 and FIG. 16. More specifically, process 1800 may represent an aspect of the proposed concepts and schemes pertaining to a base matrix of QC-LDPC code for QC-LDPC coding. Process 1800 may include one or more operations, actions, or functions as illustrated by one or more of blocks 1810, 1820, 1830 and 1840. Although illustrated as discrete blocks, various blocks of process 1800 may be divided into additional blocks, combined into fewer blocks, or eliminated, depending on the desired implementation. Moreover, the blocks/sub-blocks of process 1800 may be executed in the order shown in FIG. 18 or, alternatively in a different order. Process 1800 may be implemented by communications system 1000 and any variations thereof. For instance, process 1800 may be implemented in or by first apparatus 1005 and/or second apparatus 1050. Solely for illustrative purposes and without limiting the scope, process 1800 is described below in the context of first apparatus 1005, although the same also applies to apparatus 1050. Process 1800 may begin at block 1810.

At 1810, process 1800 may involve processor 1010 of apparatus 1005 establishing a wireless communication link with apparatus 1050 via transceiver 1030 of apparatus 1005. Process 1800 may proceed from 1810 to 1820.

At 1820, process 1800 may involve processor 1010 selecting a codebook from a plurality of codebooks embedded in a QC-LDPC code. Process 1800 may proceed from 1820 to 1830.

At 1830, process 1800 may involve encoder 1012 of processor 1010 encoding data using the selected codebook to generate a plurality of modulation symbols of the data. Process 1800 may proceed from 1830 to 1840.

At 1840, process 1800 may involve processor 1010 controlling transmitter 1032 of transceiver 1030 to multiplex, convert, filter, amplify and radiate the modulation symbols as electromagnetic waves through one or more antennas of antenna 1036 of apparatus 1005.

In some implementations, the QC-LDPC code may include a kernel matrix (e.g., kernel matrix 1550). The kernel matrix may be formed by null bits and non-null bits arranged in four rows and fourteen columns in a pattern as follows:
Row 1: 11110010011100
Row 2: 10011111110110
Row 3: 11011000101011
Row 4: 01101111111001

In some implementations, each codebook of the plurality of codebooks may include the kernel matrix plus an additional of Q rows and Q columns, and wherein Q is either zero or a positive integer greater than zero.

In some implementations, the QC-LDPC code may include a base matrix (e.g., base matrix 1500) with the kernel matrix (e.g., kernel matrix 1550) being a portion thereof. Moreover, the base matrix may be formed by null bits and non-null bits arranged in twenty-two rows and thirty-two columns in a pattern as follows:
Row 1: 11110010011100000000000000000000
Row 2: 10011111110110000000000000000000
Row 3: 11011000101011000000000000000000
Row 4: 01101111111001000000000000000000
Row 5: 11000000000100100000000000000000
Row 6: 11000101000100010000000000000000
Row 7: 10000101010100001000000000000000
Row 8: 01000101000101000100000000000000
Row 9: 11000000000010000010000000000000
Row 10: 01000000101100000001000000000000
Row 11: 11000011000000000000100000000000
Row 12: 10000001010001000000010000000000
Row 13: 01010000000100000000001000000000
Row 14: 11000000010001000000000100000000
Row 15: 01000010000101000000000010000000
Row 16: 10000000001100000000000001000000
Row 17: 01000000010110000000000000100000
Row 18: 01000100000110000000000000010000
Row 19: 10000011000000000000000000001000
Row 20: 11000000001000000000000000000100
Row 21: 01001000000100000000000000000010
Row 22: 10000000010001000000000000000001

In some implementations, each codebook of the plurality of codebooks may correspond to a respective HARQ threads of a plurality of HARQ threads that are different from one another.

In some implementations, in selecting the codebook from the plurality of codebooks, process 1800 may involve processor 1010 selecting the codebook from the plurality of codebooks based on an initial code rate for transmission of the data, a code block size of the data, or both.

In some implementations, in selecting the codebook from the plurality of codebooks, process 1800 may involve processor 1010 performing a number of operations. For instance, process 1800 may involve processor 1010 performing the following (e.g., in accordance with logic flow 200): (1) determining whether a code block size of the data is less than a threshold code block size; (2) responsive to the code block size of the data being less than the threshold code block size, selecting a third codebook of the plurality of codebooks; (3) responsive to the code block size of the data being not less than the threshold code block size, determining whether an initial code rate for transmission of the data is greater than a threshold code rate; (4) responsive to the initial code rate being not greater than the threshold code rate, selecting a second codebook of the plurality of codebooks; and (5) responsive to the initial code rate being greater than the threshold code rate, selecting a first codebook of the plurality of codebooks. In some implementation, a size of the first codebook may be larger than a size of the second codebook. Moreover, the size of the second codebook may be larger than a size of the third codebook.

In some implementations, in selecting the codebook from the plurality of codebooks, process 1800 may involve processor 1010 performing a number of operations. For instance, process 1800 may involve processor 1010 determining a code block size of the data. Additionally, process 1800 may involve processor 1010 selecting the codebook by performing the following: (1) selecting a first codebook of the plurality of codebooks responsive to the code block size being determined to be greater than a first threshold code block size; (2) selecting a second codebook of the plurality of codebooks responsive to the code block size being determined to be greater than a second threshold code block size; and (3) selecting a third codebook of the plurality of codebooks responsive to the code block size being determined to be greater than a third threshold code block size. In some implementations, the first threshold code block size may be greater than the second threshold code block size. In some implementations, the second threshold code block size may be greater than the third threshold code block size. In some implementations, a size of the first codebook may be larger than a size of the second codebook. In some implementations, the size of the second codebook may be larger than a size of the third codebook.

In some implementations, process 1800 may further involve processor 1010 generating the QC-LDPC code that comprises a base matrix and a shift-coefficient matrix. In some implementations, the base matrix may include a parity matrix of a plurality of parity bits and an information matrix of a plurality of information bits. In some implementations, each codebook of the plurality of codebooks may include the parity matrix and a respective portion of the information matrix of a corresponding size such that sizes of the plurality of codebooks are different from one another.

In some implementations, each codebook of the plurality of codebooks may correspond to a respective design of a plurality of designs of the shift-coefficient matrix.

In some implementations, process 1800 may further involve processor 1010 storing the selected codebook in a memory associated with processor 1010 (e.g., memory 1016 or memory 1020). In some implementations, in selecting the codebook from the plurality of codebooks embedded in the QC-LDPC code, process 1800 may involve processor 1010 selecting the codebook according to one or more rules such that a small codebook requiring a shorter amount of processing latency for the encoding is selected for the encoding unless a larger codebook corresponding to a larger amount of processing latency for the encoding is necessary for the encoding.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method of wireless communication, comprising:
    selecting, by a processor of an apparatus, a codebook from a plurality of codebooks embedded in a quasi-cyclic-low-density parity-check (QC-LDPC) code;
    storing, by the processor, the selected codebook in a memory associated with the processor;
    encoding, by the processor, data using the selected codebook to generate a plurality of modulation symbols of the data; and
    controlling, by the processor, a transmitter of the apparatus to multiplex, convert, filter, amplify and radiate the modulation symbols as electromagnetic waves through one or more antennas of the apparatus,
    wherein the selecting of the codebook from the plurality of codebooks embedded in the QC-LDPC code comprises selecting the codebook according to one or more rules such that a small codebook requiring a shorter amount of processing latency for the encoding is selected for the encoding unless a larger codebook corresponding to a larger amount of processing latency for the encoding is necessary for the encoding.

2. The method of claim 1, wherein the QC-LDPC code comprises a kernel matrix, and wherein the kernel matrix is formed by null bits and non-null bits arranged in four rows and fourteen columns in a pattern as follows:
    Row 1: 11110010011100
    Row 2: 10011111110110
    Row 3: 11011000101011
    Row 4: 01101111111001.

3. The method of claim 2, wherein each codebook of the plurality of codebooks comprises the kernel matrix plus an additional of Q rows and Q columns, and wherein Q is either zero or a positive integer greater than zero.

4. The method of claim 2, wherein the QC-LDPC code comprises a base matrix with the kernel matrix being a portion thereof, and wherein the base matrix is formed by null bits and non-null bits arranged in twenty-two rows and thirty-two columns in a pattern as follows:
    Row 1: 11110010011100000000000000000000
    Row 2: 10011111110110000000000000000000
    Row 3: 11011000101011000000000000000000
    Row 4: 01101111111001000000000000000000
    Row 5: 11000000000100100000000000000000
    Row 6: 11000101000100010000000000000000
    Row 7: 10000101010100001000000000000000
    Row 8: 01000101000101000100000000000000
    Row 9: 11000000000010000010000000000000
    Row 10: 01000000101100000001000000000000
    Row 11: 11000011000000000000100000000000
    Row 12: 10000001010001000000010000000000
    Row 13: 01010000000100000000001000000000
    Row 14: 11000000100001000000000100000000
    Row 15: 01000010000101000000000010000000
    Row 16: 10000000001100000000000001000000
    Row 17: 01000000010110000000000000100000
    Row 18: 01000100000110000000000000010000
    Row 19: 10000011000000000000000000001000
    Row 20: 11000000001000000000000000000100
    Row 21: 01001000000100000000000000000010
    Row 22: 10000000010001000000000000000001.

5. The method of claim 1, wherein each codebook of the plurality of codebooks corresponds to a respective hybrid automatic repeat request (HARQ) threads of a plurality of HARQ threads that are different from one another.

6. The method of claim 1, wherein the selecting of the codebook from the plurality of codebooks comprises selecting the codebook from the plurality of codebooks based on an initial code rate for transmission of the data, a code block size of the data, or both.

7. The method of claim 1, wherein the selecting of the codebook from the plurality of codebooks comprises:
    determining whether a code block size of the data is less than a threshold code block size;
    responsive to the code block size of the data being less than the threshold code block size, selecting a third codebook of the plurality of codebooks;
    responsive to the code block size of the data being not less than the threshold code block size, determining whether an initial code rate for transmission of the data is greater than a threshold code rate;
    responsive to the initial code rate being not greater than the threshold code rate, selecting a second codebook of the plurality of codebooks; and
    responsive to the initial code rate being greater than the threshold code rate, selecting a first codebook of the plurality of codebooks,
    wherein a size of the first codebook is larger than a size of the second codebook, and
    wherein the size of the second codebook is larger than a size of the third codebook.

8. The method of claim 1, wherein the selecting of the codebook from the plurality of codebooks comprises:
    determining a code block size of the data; and
    selecting the codebook by:
        selecting a first codebook of the plurality of codebooks responsive to the code block size being determined to be greater than a first threshold code block size;
        selecting a second codebook of the plurality of codebooks responsive to the code block size being determined to be greater than a second threshold code block size; and
        selecting a third codebook of the plurality of codebooks responsive to the code block size being determined to be greater than a third threshold code block size,
    wherein the first threshold code block size is greater than the second threshold code block size,
    wherein the second threshold code block size is greater than the third threshold code block size,
    wherein a size of the first codebook is larger than a size of the second codebook, and
    wherein the size of the second codebook is larger than a size of the third codebook.

9. The method of claim 1, further comprising:
    generating, by the processor, the QC-LDPC code that comprises a base matrix and a shift-coefficient matrix,
    wherein the base matrix comprises a parity matrix of a plurality of parity bits and an information matrix of a plurality of information bits, and
    wherein each codebook of the plurality of codebooks comprises the parity matrix and a respective portion of the information matrix of a corresponding size such that sizes of the plurality of codebooks are different from one another, storing, by the processor, the selected codebook in a memory associated with the processor, wherein the selecting of the codebook from the plurality of codebooks embedded in the QC-LDPC code comprises selecting the codebook according to one or more rules such that a small codebook requiring a shorter amount of processing latency for the encoding is selected for the encoding unless a larger codebook corresponding to a larger amount of processing latency for the encoding is necessary for the encoding.

10. The method of claim 9, wherein each codebook of the plurality of codebooks corresponds to a respective design of a plurality of designs of the shift-coefficient matrix.

11. A method of wireless communication, comprising:
establishing, by a processor of an apparatus, a wireless communication link with another apparatus via a transceiver of the apparatus;
selecting, by the processor, a codebook from a plurality of codebooks embedded in a quasi-cyclic-low-density parity-check (QC-LDPC) code;
encoding, by the processor, data using the selected codebook to generate a plurality of modulation symbols of the data; and
controlling, by the processor, a transmitter of the transceiver to multiplex, convert, filter, amplify and radiate the modulation symbols as electromagnetic waves through one or more antennas of the apparatus,
wherein the QC-LDPC code comprises a kernel matrix, and
wherein the kernel matrix is formed by null bits and non-null bits arranged in four rows and fourteen columns in a pattern as follows:
Row 1: 11110010011100
Row 2: 10011111110110
Row 3: 11011000101011
Row 4: 01101111111001.

12. The method of claim 11, wherein each codebook of the plurality of codebooks comprises the kernel matrix plus an additional of Q rows and Q columns, and wherein Q is either zero or a positive integer greater than zero.

13. The method of claim 11, wherein the QC-LDPC code comprises a base matrix with the kernel matrix being a portion thereof, and wherein the base matrix is formed by null bits and non-null bits arranged in twenty-two rows and thirty-two columns in a pattern as follows:
Row 1: 11110010011100000000000000000000
Row 2: 10011111110110000000000000000000
Row 3: 11011000101011000000000000000000
Row 4: 01101111110010000000000000000000
Row 5: 11000000001001000000000000000000
Row 6: 11000101000100010000000000000000
Row 7: 10000101010100001000000000000000
Row 8: 01000101000101000100000000000000
Row 9: 11000000000100000010000000000000
Row 10: 01000000101100000001000000000000
Row 11: 11000011000000000000100000000000
Row 12: 10000001010001000000010000000000
Row 13: 01010000000100000000001000000000
Row 14: 11000000100001000000000100000000
Row 15: 01000010000101000000000010000000
Row 16: 10000000000110000000000001000000
Row 17: 01000000010110000000000000100000
Row 18: 01000100000110000000000000010000
Row 19: 10000011000000000000000000001000
Row 20: 11000000000100000000000000000100
Row 21: 01001000000010000000000000000010
Row 22: 10000000010001000000000000000001.

14. The method of claim 11, wherein each codebook of the plurality of codebooks corresponds to a respective hybrid automatic repeat request (HARQ) threads of a plurality of HARQ threads that are different from one another.

15. The method of claim 11, wherein the selecting of the codebook from the plurality of codebooks comprises selecting the codebook from the plurality of codebooks based on an initial code rate for transmission of the data, a code block size of the data, or both.

16. The method of claim 11, wherein the selecting of the codebook from the plurality of codebooks comprises:
determining whether a code block size of the data is less than a threshold code block size;
responsive to the code block size of the data being less than the threshold code block size, selecting a third codebook of the plurality of codebooks;
responsive to the code block size of the data being not less than the threshold code block size, determining whether an initial code rate for transmission of the data is greater than a threshold code rate;
responsive to the initial code rate being not greater than the threshold code rate, selecting a second codebook of the plurality of codebooks; and
responsive to the initial code rate being greater than the threshold code rate, selecting a first codebook of the plurality of codebooks,
wherein a size of the first codebook is larger than a size of the second codebook, and
wherein the size of the second codebook is larger than a size of the third codebook.

17. The method of claim 11, wherein the selecting of the codebook from the plurality of codebooks comprises:
determining a code block size of the data; and
selecting the codebook by:
selecting a first codebook of the plurality of codebooks responsive to the code block size being determined to be greater than a first threshold code block size;
selecting a second codebook of the plurality of codebooks responsive to the code block size being determined to be greater than a second threshold code block size; and
selecting a third codebook of the plurality of codebooks responsive to the code block size being determined to be greater than a third threshold code block size,
wherein the first threshold code block size is greater than the second threshold code block size,
wherein the second threshold code block size is greater than the third threshold code block size,
wherein a size of the first codebook is larger than a size of the second codebook, and
wherein the size of the second codebook is larger than a size of the third codebook.

18. The method of claim 11, further comprising:
selecting a second codebook of the plurality of codebooks responsive to the code block size being determined to be greater than a second threshold code block size; and
selecting a third codebook of the plurality of codebooks responsive to the code block size being determined to be greater than a third threshold code block size,
wherein the first threshold code block size is greater than the second threshold code block size,
wherein the second threshold code block size is greater than the third threshold code block size, wherein a size of the first codebook is larger than a size of the second codebook, and wherein the size of the second codebook is larger than a size of the third codebook.

19. The method of claim 11, further comprising:

generating, by the processor, the QC-LDPC code that comprises a base matrix and a shift-coefficient matrix, wherein the base matrix comprises a parity matrix of a plurality of parity bits and an information matrix of a plurality of information bits, wherein each codebook of the plurality of codebooks comprises the parity matrix and a respective portion of the information matrix of a corresponding size such that sizes of the plurality of codebooks are different from one another, and wherein each codebook of the plurality of codebooks corresponds to a respective design of a plurality of designs of the shift-coefficient matrix.

* * * * *